United States Patent
Choi et al.

(10) Patent No.: US 12,491,532 B2
(45) Date of Patent: Dec. 9, 2025

(54) APPARATUS AND METHOD FOR TREATING SUBSTRATE

(71) Applicant: SEMES CO., LTD., Cheonan-si (KR)

(72) Inventors: Jun Young Choi, Cheonan-si (KR); Gui Su Park, Cheonan-si (KR); Young Jin Jang, Cheonan-si (KR); Eun Jung Lee, Cheonan-si (KR); Jun Hyun Lim, Cheonan-si (KR)

(73) Assignee: SEMES CO., LTD., Chungcheongnam-Do (KR)

( * ) Notice: Subject to any disclaimer, the term of this patent is extended or adjusted under 35 U.S.C. 154(b) by 0 days.

(21) Appl. No.: 18/342,797

(22) Filed: Jun. 28, 2023

(65) Prior Publication Data
US 2024/0216940 A1    Jul. 4, 2024

(30) Foreign Application Priority Data
Dec. 28, 2022   (KR) .................. 10-2022-0187891

(51) Int. Cl.
*B05C 9/06*     (2006.01)
*B05C 11/10*    (2006.01)
*B05C 13/02*    (2006.01)
*B05D 1/22*     (2006.01)

(52) U.S. Cl.
CPC ............ *B05C 9/06* (2013.01); *B05C 11/1042* (2013.01); *B05C 13/02* (2013.01); *B05D 1/22* (2013.01)

(58) Field of Classification Search
None
See application file for complete search history.

(56) References Cited

U.S. PATENT DOCUMENTS

| | | | |
|---|---|---|---|
| 2012/0064727 A1* | 3/2012 | Oh | H01L 21/67748 156/345.23 |
| 2015/0332940 A1* | 11/2015 | Wang | H01L 21/67781 134/25.1 |
| 2017/0309501 A1* | 10/2017 | Kitamura | B01F 23/23 |

(Continued)

FOREIGN PATENT DOCUMENTS

| | | |
|---|---|---|
| JP | 2004-158588 A | 6/2004 |
| JP | 2017-055023 A | 3/2017 |

(Continued)

OTHER PUBLICATIONS

Korean Office Action dated Sep. 26, 2024 for corresponding Korean Patent Application No. 10-2022-0187891 and its English-language translation.

*Primary Examiner* — Shamim Ahmed
*Assistant Examiner* — Bradford M Gates
(74) *Attorney, Agent, or Firm* — Harness, Dickey & Pierce, P.L.C.

(57) ABSTRACT

The inventive concept provides a substrate treating apparatus. The substrate treating apparatus includes a liquid treating chamber; a support configured to support a substrate within the liquid treating chamber; a first treating liquid supply unit configured to supply a first treating liquid to the liquid treating chamber to treat the substrate with the first treating liquid; and a second treating liquid supply unit configured to supply a second treating liquid to the liquid treating chamber to treat the substrate with the second treating liquid, and wherein the second treating liquid supply unit includes a cooler for cooling the second treating liquid.

13 Claims, 16 Drawing Sheets

(56) References Cited

U.S. PATENT DOCUMENTS

2021/0111038 A1* 4/2021 Kanagawa ........ H01L 21/67748
2021/0202274 A1* 7/2021 Yang ................ H01L 21/67017

FOREIGN PATENT DOCUMENTS

| KR | 10-2001-0006830 A | 1/2001 |
| KR | 10-2003-0026040 A | 3/2003 |
| KR | 100789886 B1 | 12/2007 |
| KR | 10-2022-0020100 A | 2/2022 |

* cited by examiner

APPARATUS AND METHOD FOR TREATING SUBSTRATE

CROSS-REFERENCE TO RELATED APPLICATIONS

A claim for priority under 35 U.S.C. § 119 is made to Korean Patent Application No. 10-2022-0187891 filed on Dec. 28, 2022, in the Korean Intellectual Property Office, the entire contents of which are hereby incorporated by reference.

TECHNICAL FIELD

Embodiments of the inventive concept described herein relate to a substrate treating apparatus and method, more specifically, a substrate treating apparatus and method for treating a substrate by supplying a treating liquid onto the substrate.

BACKGROUND

In order to manufacture a semiconductor element, a desired pattern is formed on a substrate such as a wafer through various processes such as a photolithography process, an etching process, an ashing process, an ion implantation process, and a thin film deposition process on the substrate. In each process, various treating liquids and treating gases are used, and particles and process by-products are generated during the process. A liquid treatment process for the substrate is performed before and after each process in order to remove a thin film, particles, and process by-products on the substrate from the substrate. Generally, in a liquid treatment process, the substrate is treated with a chemical, then the chemical on the substrate is removed with a rinsing liquid, and then dried.

For example, if a phosphoric acid solution is used as the chemical, substrates are immersed in a high-temperature phosphoric acid solution filled in a chemical bath to treat the substrate with the phosphoric acid solution. Thereafter, the substrates are immersed in a high-temperature pure water filled in a rinsing bath to rinse the substrate.

However, in the case of the above-described method, the fine phosphate particles remaining on the substrate in the rinsing bath are not easily separated from the substrate, or are not discharged to an outside in the rinsing bath.

SUMMARY

Embodiments of the inventive concept provide a substrate treating apparatus and method for efficiently liquid treating a substrate.

Embodiments of the inventive concept provide a substrate treating apparatus and method for increasing a removal rate of a chemical on a substrate, when removing the chemical on the substrate with a rinsing liquid after treating the substrate with the chemical.

The technical objectives of the inventive concept are not limited to the above-mentioned ones, and the other unmentioned technical objects will become apparent to those skilled in the art from the following description.

The inventive concept provides a substrate treating apparatus. The substrate treating apparatus includes a liquid treating chamber; a support configured to support a substrate within the liquid treating chamber; a first treating liquid supply unit configured to supply a first treating liquid to the liquid treating chamber to treat the substrate with the first treating liquid; and a second treating liquid supply unit configured to supply a second treating liquid to the liquid treating chamber to treat the substrate with the second treating liquid, and wherein the second treating liquid supply unit includes a cooler for cooling the second treating liquid.

In an embodiment, the substrate treating apparatus further includes a controller configured to control the first treating liquid supply unit and the second treating liquid supply unit, and wherein the controller controls the first treating liquid supply unit and the second treating liquid supply unit so that after the substrate is treated with the first treating liquid, the second treating liquid replaces the first treating liquid on the substrate.

In an embodiment, the controller controls the cooler so that the second treating liquid is cooled to be a temperature lower than a freezing point of the first treating liquid.

In an embodiment, the first treating liquid includes a phosphoric acid solution, the first treating liquid supply unit includes a heater for heating the phosphoric acid solution, and the second treating liquid includes a water.

In an embodiment, the liquid treating chamber includes: a first treating bath in fluid communication with the first treating liquid supply unit to receive the first treating liquid; a second treating bath in fluid communication with the second treating liquid supply unit to receive the second treating liquid; and a transfer unit for transferring the substrate from the first treating bath to the second treating bath.

In an embodiment, the second treating bath includes: an inner bath providing a space for receiving the second treating liquid and for immersing a plurality of substrates in the second treating liquid; and, an outer bath receiving at least a portion of the second treating liquid which has overflowed from the inner bath; a liquid supply pipe supplying the second treating liquid to the inner bath from the second treating liquid supply unit; and a circulation line connected to a bottom of the outer bath and the liquid supply pipe to circulate the second treating liquid, the second treating liquid supply unit includes the liquid supply pipe and the circulation line.

In an embodiment, the cooler is provided at the circulation line.

In an embodiment, the support unit is positioned at the inner bath, and the liquid supply pipe is positioned below the support unit within the inner bath.

In an embodiment, the substrate treating apparatus further includes: a solvent treating unit configured to supply an organic solvent to the substrate to replace the second treating liquid with the organic solvent; and a drying unit configured to dry the substrate one at a time using a supercritical fluid.

In an embodiment, the liquid treating unit includes a cup providing a treating space therein, and wherein the support unit includes a spin chuck which supports and rotates the substrate in a horizontal state within the treating space, and wherein the substrate treating apparatus further includes a controller configured to control the first treating liquid supply unit and the second treating liquid supply unit, and wherein the controller controls the first treating liquid supply unit and the second treating liquid supply unit to sequentially supply the first treating liquid and the second treating liquid to the substrate in a state in which the substrate is supported on the spin chuck, so the first treating liquid on the substrate is replaced with the second treating liquid.

The inventive concept provides a substrate treating method. The substrate treating method includes liquid treating a substrate with a first treating liquid; and replacing the first treating liquid on the substrate with a second treating liquid, and wherein the second treating liquid is provided in a temperature lower than a freezing point of the first treating liquid.

In an embodiment, the second treating liquid includes a water, and the second treating liquid is cooled and then supplied to the substrate.

In an embodiment, the first treating liquid includes a phosphoric acid solution, and the first treating liquid is heated and then supplied to the substrate.

In an embodiment, the liquid treating includes immersing a plurality of substrates within a first treating bath filled with the first treating liquid, and the replacing the first treating liquid includes immersing the plurality of substrates within a second treating bath filled with the second treating liquid.

In an embodiment, the substrate treating method further includes: drying the substrate one by one using a supercritical fluid after the replacing the first treating fluid.

In an embodiment, the substrate treating method further includes: replacing the second treating liquid on the substrate one by one with an organic solvent by supplying the organic solvent to the substrate after the replacing the first treating fluid, and wherein the drying the substrate includes drying an organic solvent on the substrate with the supercritical fluid.

In an embodiment, the second treating bath includes: an inner bath storing the second treating liquid; an outer bath storing at least a portion of the second treating liquid which has overflowed from the inner bath; and a circulation line which circulates the second treating liquid, and the replacing the first treating fluid includes supplying the second treating liquid through a supply pipe coupled to the inner bath to overflow at least a portion of the second treating liquid from the inner bath to the outer bath and to circulate between the inner bath and the outer bath via the supply pipe and the circulation line and wherein the supply pipe is positioned below the plurality of substrates positioned in the inner bath.

In an embodiment, the liquid treating further includes supplying the first treating liquid to the substrate which is supported on and which rotates together with a spin chuck, and wherein the replacing the first treating fluid further includes supplying the second treating liquid to the substrate which rotates with the spin chuck.

The inventive concept provides a substrate treating method. The substrate treating method includes treating a plurality of substrates with a first treating liquid by immersing the plurality of substrates in a first treating bath filled with the first treating liquid including a phosphoric acid; transferring the plurality of substrates to a second treating bath; and immersing the plurality of substrates in the second treating bath filled with a second treating liquid including a water to replace the first treating liquid on the plurality of substrates with the second treating liquid, and wherein the first treating liquid is heated and then provided in the first treating bath, and the second treating liquid in the second treating bath is provided at a temperature lower than a freezing point of the first treating liquid.

In an embodiment, the second treating bath includes: an inner bath storing the second treating liquid; an outer bath storing the second treating liquid which has overflowed from the inner bath; and a circulation line which circulates the second treating liquid, and the immersing the plurality of substrates includes supplying the second treating liquid through a supply pipe coupled to the inner bath to overflow at least a portion of the second treating liquid from the inner bath to the outer bath and to circulate between the inner bath and the outer bath via the supply pipe and the circulation line, and wherein the supply pipe is positioned below the plurality of substrates immersed in the inner bath.

According to an embodiment of the inventive concept, a substrate may be efficiently treated.

According to an embodiment of the inventive concept, a removal rate of a chemical may be increased, when removing a chemical remaining on a substrate, which has been treated with the chemical, with a rinsing liquid.

The effects of the inventive concept are not limited to the above-mentioned ones, and the other unmentioned effects will become apparent to those skilled in the art from the following description.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
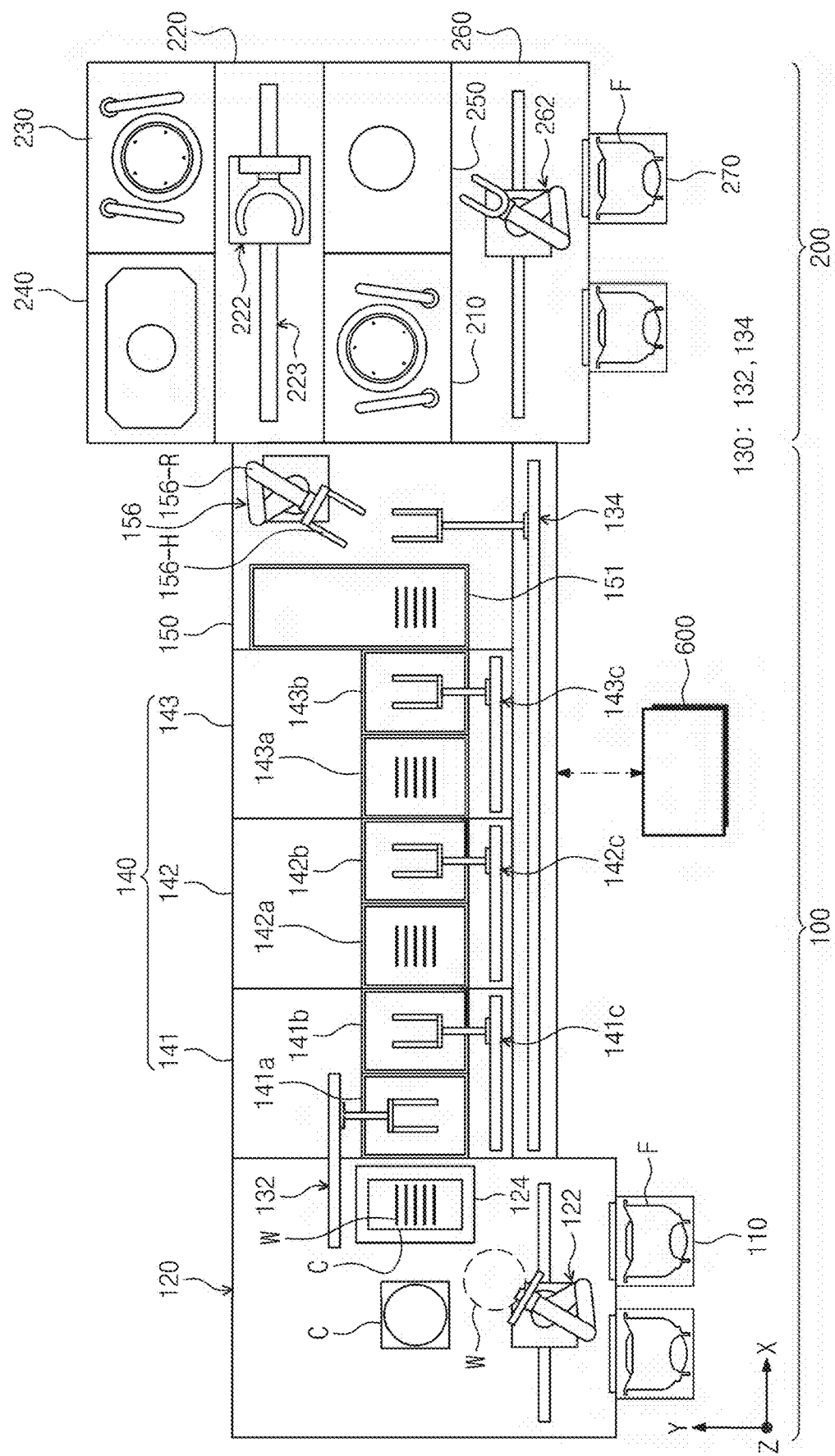
FIG. 1 is a plan view schematically illustrating a substrate treating apparatus according to an embodiment of the inventive concept.

The inventive concept may be variously modified and may have various forms, and specific embodiments thereof will be illustrated in the drawings and described in detail. However, the embodiments according to the concept of the inventive concept are not intended to limit the specific disclosed forms, and it should be understood that the present inventive concept includes all transforms, equivalents, and replacements included in the spirit and technical scope of the inventive concept. In a description of the inventive concept, a detailed description of related known technologies may be omitted when it may make the essence of the inventive concept unclear.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises", "comprising,", "includes", and/or "including" when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Also, the term "example" is intended to refer to an example or illustration.

It will be understood that, although the terms "first", "second", "third", etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the inventive concept.

It should be understood that when an element or layer is referred to as being "on," "connected to," "coupled to," or "covering" another element or layer, it may be directly on, connected to, coupled to, or covering the other element or layer or intervening elements or layers may be present. In contrast, when an element is referred to as being "directly on," "directly connected to," or "directly coupled to" another element or layer, there are no intervening elements or layers present. Other terms such as "between", "adjacent", "near" or the like should be interpreted in the same way.

Unless otherwise defined, all terms used herein, including technical or scientific terms, have the same meaning as those generally understood by those skilled in the art to which the inventive concept belongs. Terms such as those defined in commonly used dictionaries should be interpreted as consistent with the context of the relevant technology and not as ideal or excessively formal unless clearly defined in this application.

Also, a configuration transferring a substrate W to be described later, for example, a transfer unit or transfer robots to be described later, may be referred to as a transfer module.

Hereinafter, an embodiment of the inventive concept will be described with reference to FIG. 1 to FIG. 16.

FIG. 1 is a schematic view of a substrate treating apparatus according to an embodiment of the inventive concept as viewed from above.

Referring to FIG. 1, the substrate treating apparatus 10 according to an embodiment of the inventive concept may include a first process treating unit 100, a second process treating unit 200, and a controller 600. The first process treating unit 100 and the second process treating unit 200 may be arranged in a direction when viewed from above.

Hereinafter, a direction in which the first process treating unit 100, the second process treating unit 200, and the controller are arranged is referred to as a first direction X, a direction perpendicular to the first direction X when viewed from above is referred to as a second direction Y, and a direction perpendicular to the first direction X and the second direction Y is referred to as a third direction Z.

The first process treating unit 100 may collectively liquid treat a plurality of substrates W in a batch manner. For example, a liquid treatment may be a cleaning treatment of removing an unnecessary layer or a particle from a substrate. The first process treating unit 100 may simultaneously process the plurality of substrates W in a state in which a pattern surface of the substrate W is in a direction perpendicular to the ground.

The first process treating unit 100 may include a first load port unit 110, an index chamber 120, a transfer unit 130, a liquid treating unit, and a posture change portion 150.

The first load port unit 110 may include at least one load port. A transfer container F in which the substrate W is stored may be placed on the load ports of the first load port unit 110. The plurality of substrates W may be stored in the transfer container F. For example, 25 substrates may be stored in the transfer container F. The transfer container F may be referred to as a cassette, a pod FOD, a FOUP, or the like. The transfer container F may be loaded onto the first load port unit 110 by a container transfer apparatus. The substrates W stored in the transfer container F placed in the first load port unit 110 may be untreated substrates W. An untreated substrate W may be, for example, a substrate W which has not been treated, or substrates W which have been partially treated but require a liquid treatment.

In addition, the container F in which the untreated substrate W is stored may be placed on the first load port unit 110. That is, the first load port unit 110 may serve to load the substrate W requiring a treatment.

The first load port unit 110 may be coupled to the index chamber 120. The index chamber 120 and the first load port unit 110 may be arranged in the second direction Y. The index chamber 120 may include an index robot 122 and a posture change unit 124. The index robot 122 may take out a substrate W which has not been treated or which requires a treatment from the container F mounted on the first load port unit 110. The index robot 122 may take in the substrate W from the container F and take the substrate W into the storage container C provided in the index chamber 120. The index robot 122 may have a batch hand capable of simultaneously gripping and transferring a plurality of substrates W (e.g., 25 sheets).

The storage container C may have a container shape. The storage container C may have a storage space therein. The plurality of substrates W may be stored in the storage space of the storage container C. For example, 50 substrates W may be stored in the storage space of the storage container C. The storage container C may have a container shape in which at least two or more of the surfaces of the storage container C are opened. A support member for supporting/gripping the substrate W may be provided in the storage space of the storage container C.

If the substrate W taken out from the transfer container F is completely brought into the storage container C, the storage container C may be taken to the posture change unit 124 arranged in the index chamber 120 by a transportation means which is not shown. The posture change unit 124 may rotate the storage container C. For example, the posture change unit 124 may rotate the storage container C such that an opened portion of the storage container C faces upward.

If the open portion of the storage container C is rotated to face the top, the substrate W stored in the storage container C may be changed from the horizontal posture (a posture in which the top and bottom surfaces of the substrate W are horizontal to the ground) to the vertical posture. The horizontal posture may mean that the top surface of the substrate W (e.g., a patterned surface) is parallel to an X-Y plane (i.e., the ground), and the vertical posture may mean that the top surface of the substrate W is parallel to an X-Z plane or a Y-Z plane (i.e., a surface perpendicular to the ground).

The transfer unit 130 may include a first transfer unit 132 which transfers the substrate W between the index chamber 120 and the batch-type treating unit 140, and a second transfer unit 134 which transfers the substrate W between the batch-type treating unit 140 and the posture change portion 150 to be described later.

The first transfer unit 132 may include a rail extending along the first direction X and a hand configured to transfer the plurality of substrates W at once. The first transfer unit 132 may grip the substrates W which posture has been changed in a posture change unit 124 and transfer a gripped substrate W to the liquid treating unit. For example, the first transfer unit 132 may transfer the substrates W which posture has been changed in the posture change unit 124 to any selected one of the batch-type treating baths 141A to 143B of the batch-type treating unit 140. The second transfer unit 134 may include a rail extending in the first direction X, and a hand configured to transfer the plurality of substrates W at once.

The second transfer unit 134 may be configured to transfer the substrate W between the first batch-type treating unit 141, the second batch-type treating unit 142, and the third batch-type treating unit 143 of the batch-type treating unit 140 to be described later. In addition, the second transfer unit 134 may be configured to transfer the substrate W between the batch-type treating unit 140 and the posture change portion 150.

The liquid treating unit may liquid treat the substrate W by supplying a treating liquid to the substrate W.

In an embodiment, the liquid treating unit is provided as a batch-type treating unit 140 which liquid treats the plurality of substrates W at once. The batch-type treating unit 140 may liquid treat a plurality of substrates W at once with the treating liquid. The batch-type treating unit 140 may clean the plurality of substrates W at once using the treating liquid. The batch-type treating unit 140 may liquid treat the plurality of substrates W at once using the treating liquid. The treating liquid used in the batch-type treating unit 140 may be a chemical and/or a rinsing liquid. For example, the chemical may be a chemical having the properties of a strong acid or a strong base. Also, the rinsing liquid can be a pure water. For example, the chemical may be chosen appropriately among an Ammonia-Hydrogen Peroxide Mix (APM), a Hydrochloride Peroxide Mix (HPM), a Hydrofluoric acid (FPM), a Hydrofluoric acid (Hydrogen Peroxide Mix), a Diluted Hydrooxide Mix (DHF), a chemical removing a SiN, a chemical including a phosphoric acid, or a chemical including a sulfuric acid. The rinsing liquid may be a liquid containing a water. For example, the rinsing liquid may be a pure water.

The batch-type treating unit 140 includes a first batch-type treating unit 141, a second batch-type treating unit 142, and a third batch-type treating unit 143.

The first batch-type treating unit 141, the second batch-type treating unit 142, the third batch-type treating unit 143 each include a chemical bath, a rinsing bath, and a batch-type transfer unit which transports substrates W between them.

In each batch-type treating unit, the substrate W is treated with a first treating liquid in the chemical bath, and then treated with a second treating liquid in the rinsing bath. The first treating liquid may be a chemical, and the second treating liquid may be a rinsing liquid.

A posture is changed by the posture change unit 124 and the substrates W stored in the storage container C and the substrates W stored in the batch-type treating bath of the batch-type treating unit 140 may be arranged side by side in the first direction X when viewed from above.

In addition, the substrates W stored in the batch-type treating baths 141a to 143b of the batch-type treating unit 140 and the substrates W stored in the posture change treating bath 151 of the posture change portion 150 may be arranged side by side along the first direction X when viewed from the top. In addition, the substrates W housed in the batch-type treating baths 141a to 143b of the batch-type treating unit 140 may be arranged side by side along the first direction X when viewed from the top. That is, the support unit 520 of each of the batch-type treating baths 141a to 143b and the support member 153 of the posture change treating bath 151 may be arranged side by side in the first direction X when viewed from above.

The first batch-type treating unit 141 may include a first chemical bath 141a, a first rinsing bath 141b, and a first batch-type transfer unit 141c.

In the first chemical bath 141A, a plurality of substrates W may be simultaneously liquid-treated with a chemical such as a DHP. In the first rinsing bath 141B the plurality of substrates W may be simultaneously treated with a rinsing liquid. However, the inventive concept is not limited thereto, and the treating liquid used in the first chemical bath 141A may be variously transformed into a treating liquid selected from the aforementioned treating liquid.

In the first chemical bath 141a, a thin film on the substrate W, a residual membrane on the substrate W, or an impurity on the substrate W may be removed by the chemical. In the first rinsing bath 141b, the plurality of substrates W may be simultaneously treated with the rinsing liquid such as a pure water. In the first rinsing bath 141B, the chemical remaining on the substrate W after being used during a treatment of the substrate W in the first chemical bath 141A is removed from the substrate W.

The first batch-type transfer unit 141c may be configured to transfer the substrate W between the first chemical bath 141a and the first rinsing bath 141b.

The second batch-type treating unit 142 may include a second chemical bath 142a, a second rinsing bath 142b, and a second batch-type transfer unit 142c.

In the second chemical bath 142a, the plurality of substrates W may be simultaneously liquid-treated with a chemical containing a phosphoric acid. In the second rinsing bath 142b, the plurality of substrates W may be simultaneously treated with the rinsing liquid. However, the inventive concept is not limited thereto, and the treating liquid used in the second chemical bath 142a may be variously modified to a treating liquid selected from the above-described treating liquids.

The second batch-type transfer unit 142c may be configured to transfer the substrate W between the second chemical bath 142a and the second rinsing bath 142b.

The third batch-type treating unit 143 may include a third chemical unit 143a, a third rinsing bath 143b, and a third batch-type transfer unit 143c.

In the third chemical unit 143a, the plurality of substrates W may be simultaneously liquid-treated with the chemical containing the phosphoric acid. In the third rinsing bath 143b, the plurality of substrates W may be simultaneously treated with the rinsing liquid. However, the inventive concept is not limited thereto, and the treating liquid used in the third chemical unit 143a may be variously modified to a treating liquid selected from the aforementioned treating liquids.

The third batch-type transfer unit 143c may be configured to transfer the substrate W between the third chemical unit 143a and the third rinsing bath 143b.

According to an embodiment, the second batch-type treating unit 142 and the third batch-type treating unit 143 may treat the substrate W with the same chemical, and the first batch-type treating unit 141 may treat the substrate W with a different chemical from the second batch-type treating unit 142 or the third batch-type treating unit 143. Hereinafter, the second batch-type treating unit 142 and the third batch-type treating unit 143 treat the substrate W with an phosphoric acid solution, and the first batch-type treating unit 141 may treat the substrate W with any of the chemicals described above.

In FIG. 1, the batch-type treating unit 140 includes a first batch-type treating unit 141, a second batch-type treating unit 142, and a third batch-type treating unit 143, but the inventive concept is not limited thereto.

For example, an additional batch-type treating unit may be further provided. The additional batch-type treating unit may treat the substrate W with the same or different chemicals as the first batch-type treating unit 141, the second batch-type treating unit 142, or the third batch-type treating unit 143.

Selectively, the batch-type treating unit 140 may include only the second batch-type treating unit 142 and the third batch-type treating unit 143 without the first batch-type treating unit 141.

Selectively, the batch-type treating unit 140 may include only the second batch-type treating unit 142.

Hereinafter, a structure of the batch-type treating unit 140 will be described in detail.

The first batch-type treating unit 141, the second batch-type treating unit 142, and the third batch-type treating unit 143 are provided in the same or similar structure. Hereinafter, the second batch-type treating unit 142 will be mainly described.

The second batch-type treating unit 142 has a second chemical bath 142a, a second rinsing bath 142b, and a second batch-type transfer unit 142c.

Figure 2:
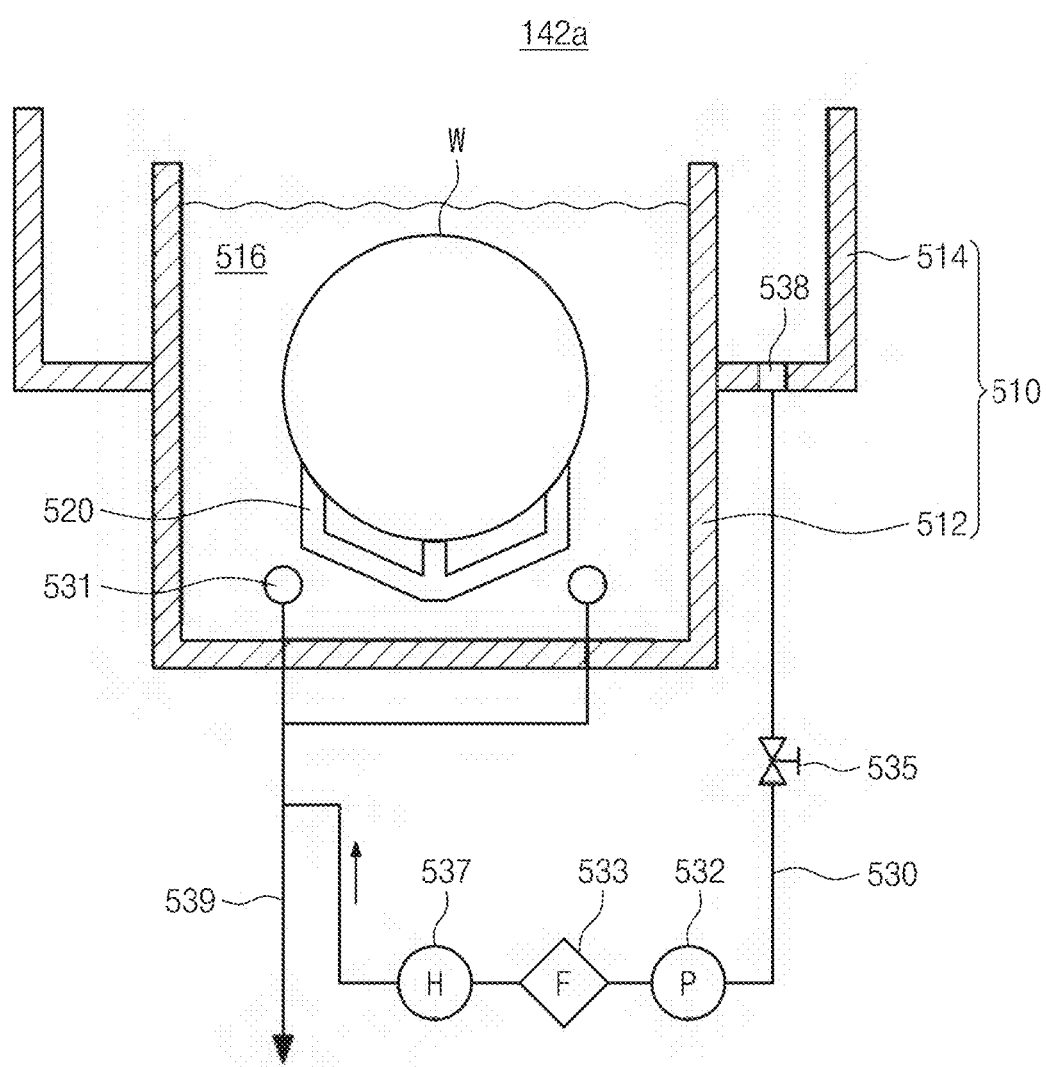
FIG. 2 schematically illustrates a chemical of a batch-type treating unit of FIG. 1.

FIG. 2 is a view schematically illustrating a structure of a second chemical bath.

The second chemical bath 142a has a liquid bath 510, a support unit 520, a circulation line 530, and a liquid supply pipe 531.

The liquid bath 510 may include an inner bath 512 and an outer bath 514. The inner bath 512 may have an storage space 516. The inner bath 512 may have a container shape with an open top. For example, the inner bath 512 may have a rectangular parallelepiped shape. An phosphoric acid solution may be stored in the storage space 516.

The outer bath 514 is provided to surround the inner bath 512 at an outside of the inner bath 512. For example, the outer bath 514 has a rectangular parallelepiped container shape similar to the inner bath 512. The outer bath 514 is provided in a larger size than the inner bath 512. The outer bath 514 stores the phosphoric acid solution overflowing from the inner bath 512. An outlet 538 for discharging the phosphoric acid solution is formed in the outer bath 514. The outlet 538 is formed on a bottom surface of the outer bath 514. The phosphoric acid solution overflowing from the inner bath 512 to the outer bath 514 is discharged to the circulation line 530 to be described later through the outlet 538.

The support unit 520 is disposed in the storage space 516. The support unit 520 may support the substrate W. The support unit 520 may be configured to support the plurality of substrates W. For example, the support unit 520 may be configured to support 25 or 50 substrates W.

Figure 3:
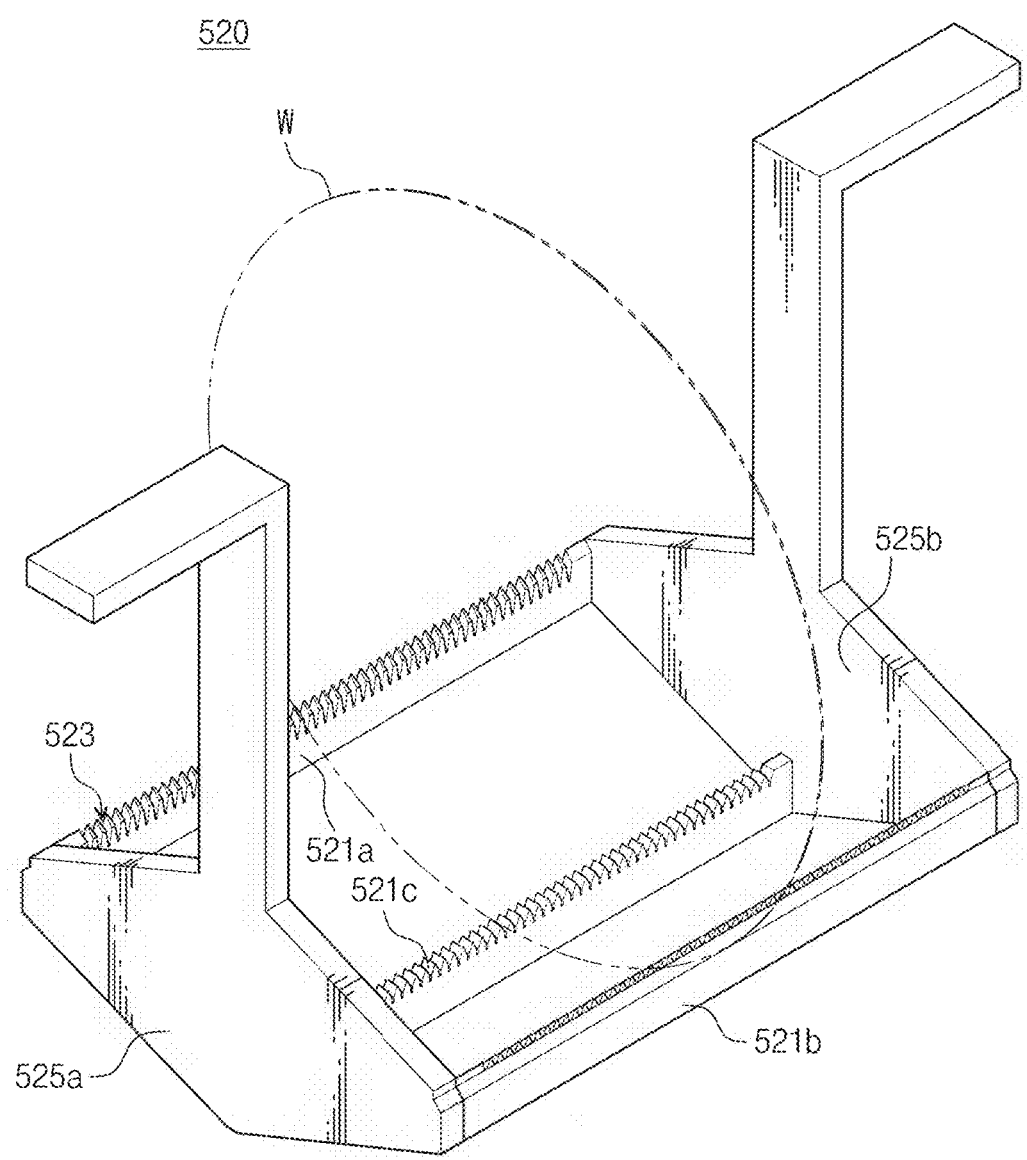
FIG. 3 is a perspective view schematically illustrating an embodiment of a support unit of a chemical bath of FIG. 2.

FIG. 3 is a perspective view illustrating an embodiment of the support unit of FIG. 2.

The support unit 520 has a support 521 and a fixing plate 525.

A plurality of supports 521 are provided. Two to five supports 521 may be provided so that the substrates W are stably supported. According to an embodiment, a first support 521a, a second support 521b, and a third support 521c are provided. Each of the first support 521a, the second support 521b, and the third support 521c has a rod shape. The first support 521a and the second support 521b are spaced apart from each other at the same height.

The first support 521a and the second support 521b support a side end of the substrate W. The first support 521a and the second support 521b are disposed to face each other.

The third support 521c is positioned between the first support 521a and the second support 521b when viewed from above. The third support 521c is disposed at a position lower than the first support 521a. The third support 521c supports a bottom end of the substrate W.

A plurality of slots 523 are formed at a top end of the supports 521a, 521b, 521c at predetermined intervals in a lengthwise direction of the supports 521a, 521b, 521c. An edge of the substrate W may be inserted into the slot 523. The slots 523 are formed in a number corresponding to the number of substrates W. For example, 25 or 50 slots 523 may be formed.

The fixing plate 525 fixes the supports 521a, 521b, and 521c to each other. Two fixing plates 525 are provided. An end of the supports 521a, 521b, and 521c is coupled to the first fixing plate 525a. The other ends of the supports 521a, 521b, and 521c are coupled to the second fixing plate 525b.

Referring back to FIG. 2, the circulation line 530 circulates the phosphoric acid solution in the liquid bath 510. An end of the circulation line 530 is connected to the outlet 538 of the outer bath 514 and the other end thereof is connected to the liquid supply pipe 531 of the liquid L. In addition, a drain line 539 for discharging a waste liquid therein may be connected to the inner bath 512. The drain line 539 may be branched from the circulation line.

A pump 532, a filter 533, a valve 535, and a heater 537 are installed in the circulation line 530. The pump 532 provides a flow pressure to the phosphoric acid solution so that the phosphoric acid solution circulates along the circulation line 530.

The filter 533 removes foreign substances from the phosphoric acid solution circulating in the circulation line 530.

The valve 535 opens and closes the circulation line 530. If the valve 535 is opened, the phosphoric acid solution in the liquid bath 510 is continuously circulated along the circulation line 530.

The heater 537 may heat a temperature of the phosphoric acid solution supplied to the inner bath 512 to a predetermined temperature.

The liquid supply pipe 531 supplies the phosphoric acid solution to the inner bath 512. The liquid supply pipe 531 is disposed in the inner bath 512. The liquid supply pipe 531 may be disposed below the support unit 520 in the inner bath 512.

The liquid supply pipe 531 is disposed in a lengthwise direction parallel to an arrangement direction of the substrates W. A plurality of supply holes are formed in the liquid supply pipe 531 along a lengthwise direction thereof. The supply hole may be formed at a top end of the liquid supply pipe 531. A circulation line 141-B1-530 is connected to an end of the liquid supply pipe 531. The other end of the liquid supply pipe 531 may be provided as a blocking surface.

A plurality of liquid supply pipes 531 may be provided. In this case, the liquid supply pipes 531 may be disposed parallel to each other.

Selectively, a bubble supply pipe (not shown) providing bubbles may be installed within the inner bath 512. The bubble supply pipe may be disposed below the support unit 520 in the inner bath 512.

Figure 4:
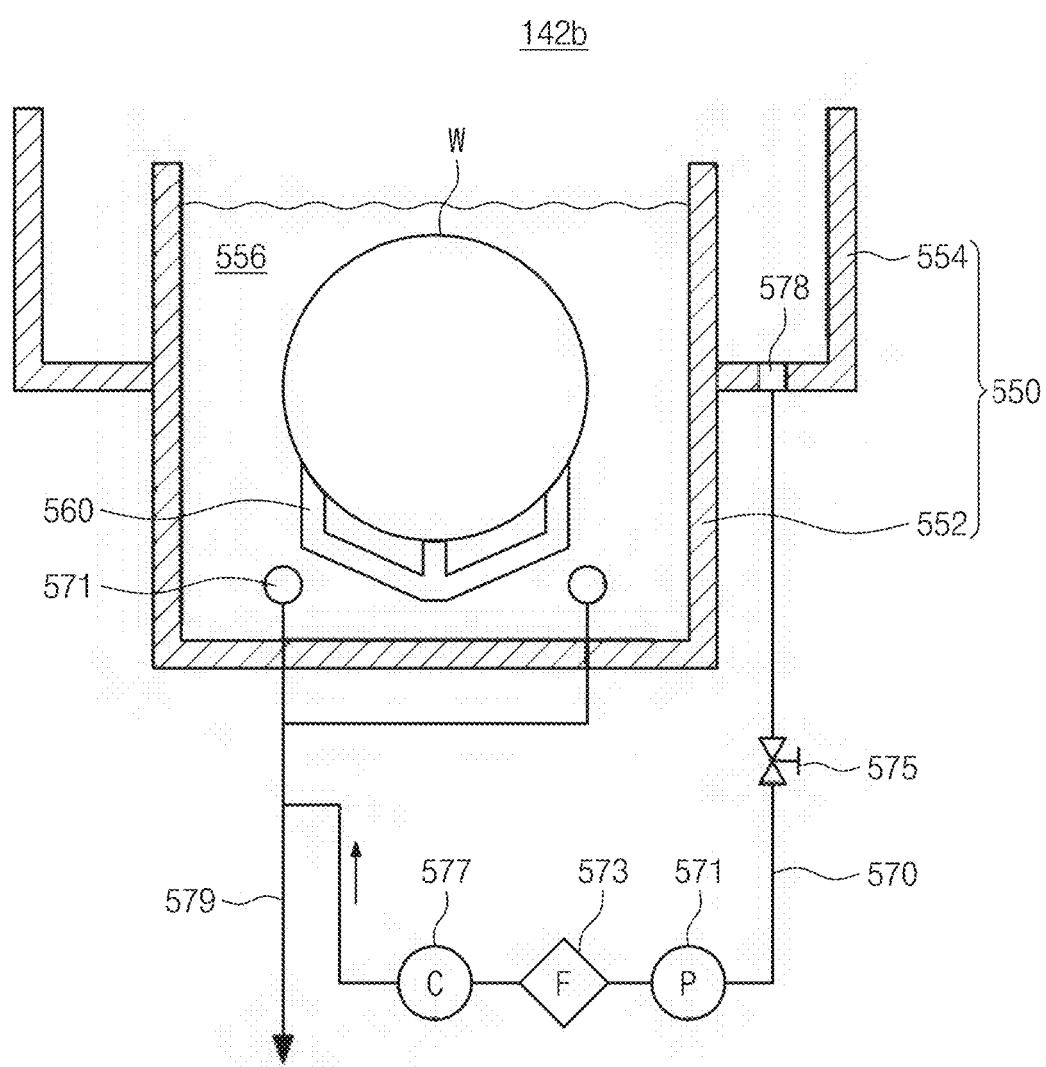
FIG. 4 schematically illustrates a rinsing bath of the batch-type treating unit of FIG. 1.

FIG. 4 is a view schematically illustrating a structure of the second rinsing bath of FIG. 1.

The second rinsing bath 142b has a liquid bath 550, a support unit 560, a circulation line 570, and a liquid supply pipe 571.

The liquid bath 550 may have an inner bath 552 and an outer bath 554. The inner bath 552 and the outer bath 554 may have the same shape and structure as the inner bath 512 and the outer bath 554 of the second chemical bath 142a. The support unit 560 is disposed in the storage space 556. The support unit 560 may support the substrate W. The support unit 560 may have the same structure and shape as the support unit 520 in the second chemical bath 142a.

The circulation line 570 circulates a pure water within the liquid bath. An end of the circulation line 570 is connected to the outlet 578 of the outer bath 554, and the other end thereof is connected to the liquid supply pipe 571.

In addition, a drain line 579 for discharging the waste liquid therein may be connected to the inner bath 552. The drain line 579 may be branched from the circulation line.

A pump 572, a filter 573, a valve 575, and a cooler 577 are installed in the circulation line 570.

The pump 572, the filter 573, and the valve 575 may perform the same function as the pump 532, the filter 533, and the valve 535 of the second chemical bath 142a and may be disposed the same or similar. The cooler 577 may cool a supply temperature of the pure water supplied to the inner bath 552 to a set temperature. According to an embodiment, the cooler 577 cools to a temperature lower than a freezing point of the phosphoric acid solution used in the second chemical bath 142a.

The liquid supply pipe 571 supplies the pure water to the inner bath 552. The liquid supply pipe 571 may be provided in the same structure and arrangement as the liquid supply pipe 531 of the second chemical bath 142a.

Selectively, the bubble supply pipe (not shown) providing bubbles may be installed within the inner bath 552. The bubble supply pipe may be disposed below the support unit 560 in the inner bath 552.

The second batch-type transfer unit 142c may be configured to transfer the substrate W between the second chemical bath 142a and the second rinsing bath 142b.

Figure 5:
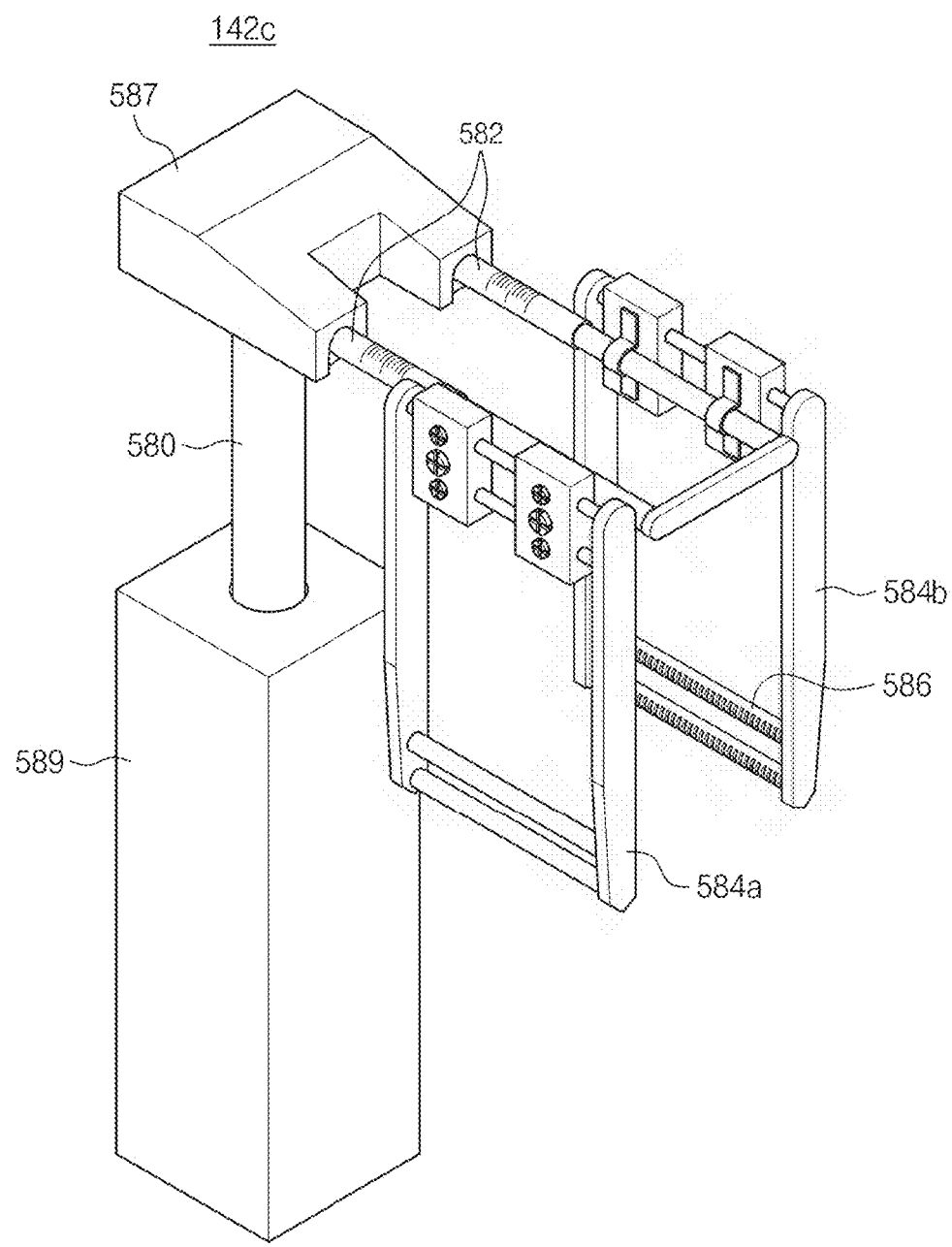
FIG. 5 is a perspective view schematically illustrating an embodiment of a second batch-type transfer unit of the batch-type treating unit of FIG. 1.

FIG. 5 is a perspective view illustrating an embodiment of the second batch-type transfer unit of FIG. 1.

Referring to FIG. 5, the second batch-type transfer unit 142c has a body 580, a grip member 582, a gripper driver 587, and a body driver 589.

The body 580 is provided coupled to a side of the second batch-type treating unit 142 and movable in a straight line.

The grip member 582 is mounted on the body 580. The grip member 582 is provided to hold the substrate W. The grip member 582 is provided to be movable in the vertical direction with respect to the body 580. The grip member 582 includes a first gripper 584a and a second gripper 584b. The first gripper 584a and the second gripper 584b are disposed to be spaced apart from each other.

The first gripper 584a and the second gripper 584b have the same structure.

Each of the grippers 584a and 584b is provided with a plurality of gripping grooves 586 in the lengthwise direction thereof.

The gripper driver 587 may move the grip member 582 between a first position and a second position.

The first position is a position at which the grip member 582 holds the substrate W, and the second position is a position at which the grip member 582 is spaced apart from the substrate W.

If moving from the second position to the first position, the first gripper 584a and the second gripper 584b may rotate in a direction facing each other.

If moving from the first position to the second position, the first gripper 584a and the second gripper 584b may rotate in a direction away from each other.

Hereinafter, an embodiment of a substrate treating method in the second batch-type treating unit according to FIG. 2 to FIG. 5 will be described.

The substrate W may be taken into the second chemical bath 142a filled with the phosphoric acid solution, and is passed to the support unit 520 positioned at the storage space 516. The substrate W is immersed in the phosphoric acid solution filled in the inner bath 512 of the second chemical bath 142a.

The phosphoric acid solution within the second chemical bath 142a circulates through the circulation line 530 and treats the substrate W with the phosphoric acid solution.

The phosphoric acid solution supplied through the liquid supply pipe 531 within the inner bath 512 flows from a bottom to a top in the storage space 516 and then overflows into the outer bath 514.

The phosphoric acid solution discharged to the outlet 538 of the outer bath 514 moves along the circulation line 530 and circulates at a set temperature through the pump 532, the filter 533, the valve 535, and the heater 537. While flowing along the circulation line 530, a foreign substance is removed from the phosphoric acid solution by the filter 533, and the phosphoric acid solution is continuously heated to the set temperature.

If the phosphoric acid solution treatment is completed, the second batch—type transfer unit 142c simultaneously takes out the substrates W and transfers the substrates W to the second rinsing bath 142b while the phosphoric acid solution is filled in the inner bath 512. Unlike this, after the phosphoric acid solution is drained through the drain line 539 of the circulation line 530, the second batch-type transfer unit 142c may take out the substrates W and move them to the second rinsing bath 142b.

The second batch-type transfer unit 142c holds the substrate W using the grip member 582, and moves the body 580 vertically and horizontally to move the gripped substrate W to the second rinsing bath 142b.

The substrate W is taken into the second rinsing bath 142b filled with a pure water by the second batch-type transfer unit 142c. The substrates W are handed over from the second batch-type transfer unit 142c to the support unit 560 disposed in the storage space 556 of the inner bath 552. The substrate W is immersed in the pure water filled in the inner bath 552 of the second rinsing bath 142b. The pure water is provided to the storage space 556 at a temperature lower than the freezing point of the phosphoric acid solution used in the second chemical bath 142a.

The pure water within the second rinsing bath 142b circulates through the circulation line 570 and treats the substrate W as a pure water.

The pure water supplied through the liquid supply pipe 571 within the inner bath 552 flows from a bottom to a top in the storage space 556, and then overflows into the outer bath 554.

The pure water discharged to the outlet 578 of the outer bath 554 moves along the circulation line 570 and circulates to a set temperature through the pump 572, the filter 573, the valve 575, and the cooler 577. While flowing along the circulation line 570, foreign substances are removed from the pure water by the filter 573, and the pure water is continuously cooled to the set temperature.

Referring back to FIG. 1, after a pure water treatment is completed, the second transfer unit 134 may take out the substrate W and transfer it to the posture change treating bath 151 while the pure water is filled in the inner bath 552. In contrast, after draining pure the water through the drain line 579 of the circulation line 570, the second transfer unit 134 can take out the substrate W and move it to the posture change treating bath 151.

In addition, if the substrate W is transferred to the posture change treating bath 151, a spray liquid treatment may be additionally performed on the substrate W to maintain a wetting of the substrate W.

According to an embodiment of the inventive concept, the set temperature of the pure water in the second rinsing bath 142b is lower than the freezing point of the phosphoric acid solution used in the second chemical bath 142a.

If the pure water at a temperature lower than the freezing point of the phosphoric acid solution is used, a removal rate of phosphoric acid particles remaining on the substrate W after a treatment with the phosphoric acid solution is improved. Hereinafter, it will be described in detail with reference to FIG. 6 and FIG. 7.

Figure 6:
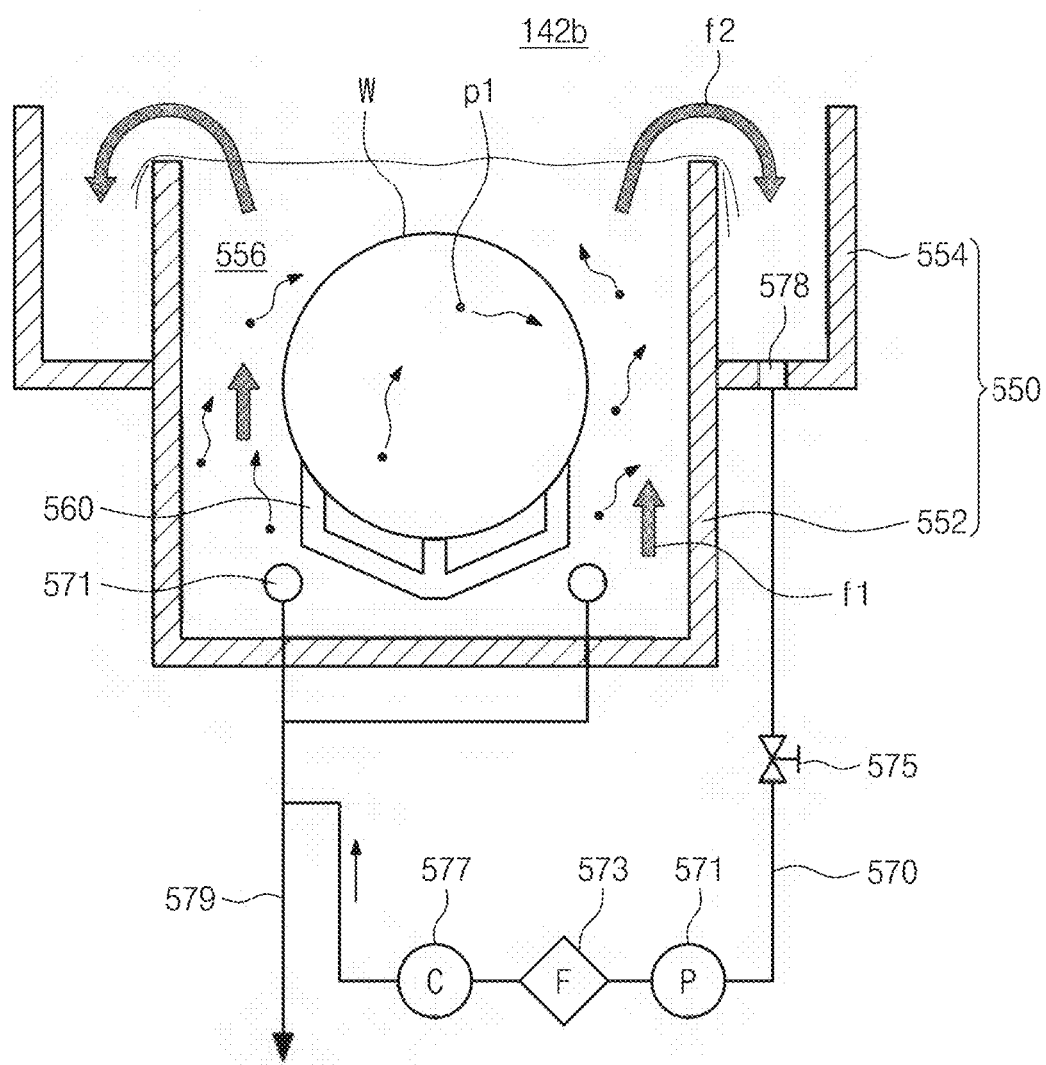
FIG. 6 schematically illustrates a flow of a pure water and particles in a rinsing bath if a substrate is rinse-treated in the rinsing bath in a conventional manner.

FIG. 6 schematically shows a movement of a phosphoric acid particle occurring within the second rinsing bath if a temperature of the pure water in the second rinsing bath is set to a temperature higher than a freezing point of the phosphoric acid solution used in the second chemical bath.

As the pure water is supplied from the liquid supply pipe 571 of the second rinsing bath 142b, the pure water flows from the bottom to the top in the storage space 556. The phosphoric acid particles are overflowed into the outer bath 554 and removed using such an upflow.

Referring to FIG. 6, if the temperature of the pure water is higher than the freezing point of the phosphoric acid solution, the phosphate particles p1 do not follow the flow directions f1, f2 of the pure water and move irregularly.

Since the phosphate particles p1 are microparticles, they drift mainly by a Brownian motion. That is, it may move irregularly in the second rinsing bath 142b which is filled with pure water due to a collision between molecules or the like. The small phosphate particles p1 are affected by this Brownian motion and do not overflow into the outer bath 554 with the pure water, but drift within the inner bath 552.

Therefore, as shown in FIG. 6, a moving direction f1 and f2 of the pure water and phosphate particles p1 do not match, and even while the pure water overflows to the outer bath 554, the phosphate particles p1 continuously remain on the substrate W surface or remain in the inner bath 552 after deviating from the substrate W surface.

Figure 7:
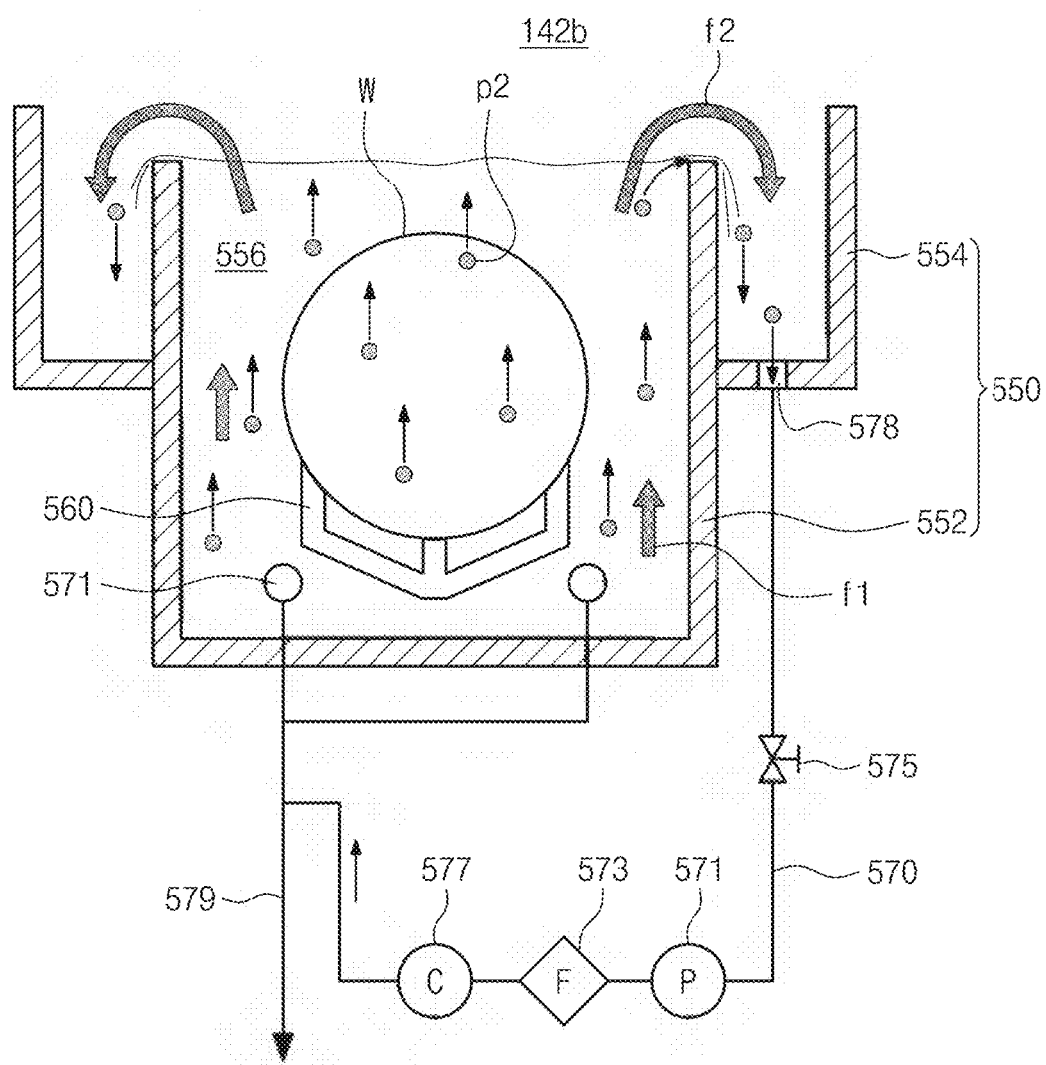
FIG. 7 schematically illustrates the flow of the pure water and particles in the rinsing bath if the substrate is rinse-treated in the rinsing bath of FIG. 3.

FIG. 7 schematically shows a movement of the phosphoric acid particle occurring within the second rinsing bath if the temperature of the pure water is set to a temperature lower than the freezing point of the phosphoric acid solution used in the second chemical bath.

Referring to FIG. 7, if the pure water is supplied at a temperature lower than the freezing point of the phosphoric acid solution, the phosphate particles p2 overflow into the outer bath 554 along with a flow of the pure water.

The phosphate particle p2 undergoes a nucleation reaction at a temperature lower than the freezing point. The nucleation reaction produces a crystal nucleus of the phosphate particle p2. Thereby, the particles of the phosphate particles p2 increase. As the phosphoric particle p2 becomes larger, an influence of the Brownian motion decreases and is dominantly influenced dominantly by a physical force.

Therefore, the crystallized phosphate particles p2 may behave depending on the physical force. The physical force may be, for example, an upflow that occurs according to the flow of the pure water within the second rinsing bath 142b. That is, the crystallized phosphate particles p2 may flow from the substrate W to the top part of the inner bath 552 and overflow into the outer bath 554 and then be discharged to the circulation line 570 as shown in FIG. 7.

In the above example, as the pure water is cooled and supplied at a lower temperature, even smaller phosphate particles p2 may be easily crystallized.

Figure 8:
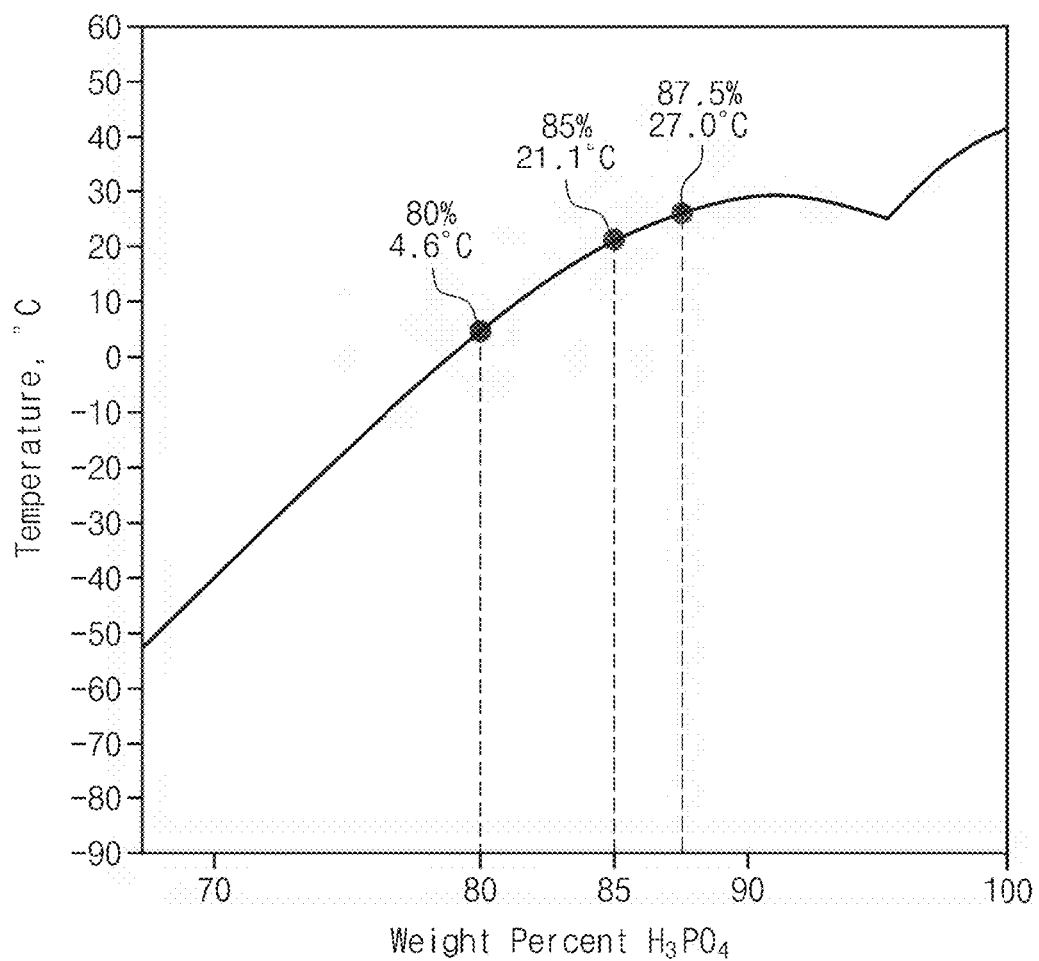
FIG. 8 is a graph showing a freezing point according to a concentration of a phosphoric acid solution.

FIG. 8 is a graph showing the freezing point according to a concentration of the phosphoric acid solution. Referring to FIG. 8, if the concentration of the phosphoric acid solution is about 85%, the phosphate particles coagulate at about 21.1° C. If the concentration of the phosphoric acid solution is about 91.6%, the phosphate particles coagulate at about 29.3° C.

According to an embodiment, the temperature of the phosphoric acid solution supplied from the second batch-type treating unit 142 is about 160° C. or more, and the concentration thereof is about 87.5%. In this case, the freezing point of the phosphoric acid solution is about 27° C. The pure water is supplied at a temperature lower than the freezing point of the phosphoric acid solution. The supply temperature of the pure water can be controlled through the cooler.

The embodiment is not limited to the concentration of the aforementioned phosphoric acid solution or the temperature of phosphoric acid. In addition, since the freezing point varies depending on the concentration of the phosphoric acid solution, a supply temperature of the pure water may also vary.

Selectively, if the freezing point of the phosphoric acid solution is higher than room temperature, the pure water may be supplied at a temperature lower than the freezing point of the phosphoric acid solution and higher than room temperature.

Selectively, if the freezing point of the phosphoric acid solution is higher than room temperature, the pure water may be supplied to room temperature. In this case, the cooler 577 may not be provided in the circulation line 570.

According to an embodiment, the second rinsing bath 142b may include a bubble supply pipe (not shown) for supplying bubbles. The bubbles may be supplied from the bottom portion of the inner bath 552 to provide a physical force to the surface of the substrate W while rising. Accordingly, the phosphoric acid solution remaining on the surface of the substrate W may be removed from the substrate W.

According to an embodiment, the circulation line 530 of the second chemical bath 142a may further include a cooler to accurately maintain the supply temperature of the phosphoric acid solution at the set temperature.

According to an embodiment, the circulation line 570 of the second rinsing bath 142*b* may further include a heater to accurately maintain the supply temperature of the pure water at the set temperature.

In the above-described embodiment, it has been described that the second batch-type treating unit 142 includes a second chemical bath 142*a* and a second rinsing bath 142*b*, respectively. However, unlike this, a liquid treatment with the phosphoric acid solution and a liquid treatment with the rinsing liquid may be sequentially performed in one liquid bath.

In the above-described embodiment, the second chemical and the second rinsing liquid have been described as an phosphoric acid solution and a pure water, respectively, but are not limited thereto. One or more treating liquids required to treat the substrate W may be appropriately selected from the treating liquids used in the batch-type treating unit 140, for example, a drying liquid such as a chemical, a rinsing liquid, or an organic solvent may.

Referring back to FIG. 1, the posture change portion 150 may change the posture of the substrate W. The posture change portion 150 may change the substrate W having the vertical posture to the horizontal posture. The posture change portion 150 may change the posture of the substrate W so that the substrate W treated in the vertical posture in the batch-type treating unit 140 may be post-treated in the single-type treating chambers 230 and 240 which treat the substrate W in the horizontal posture. The posture change portion 150 may be disposed between the batch-type treating unit 140 and the second process treating unit 200.

The posture change portion 150 may include a posture change treating bath 151 and a posture change robot 156. When viewed from above, the posture change treating bath 151 may have a greater width than the batch-type treating baths 141A to 143B. For example, when viewed from above, the posture change treating bath 151 may have a larger width in the second direction Y (a direction) than the batch-type treating baths 141A to 143B. Also, the posture change treating bath 151 may have the same width as the batch-type treating baths 141A to 143B in the first direction X (another direction) when viewed from above.

Figure 9:
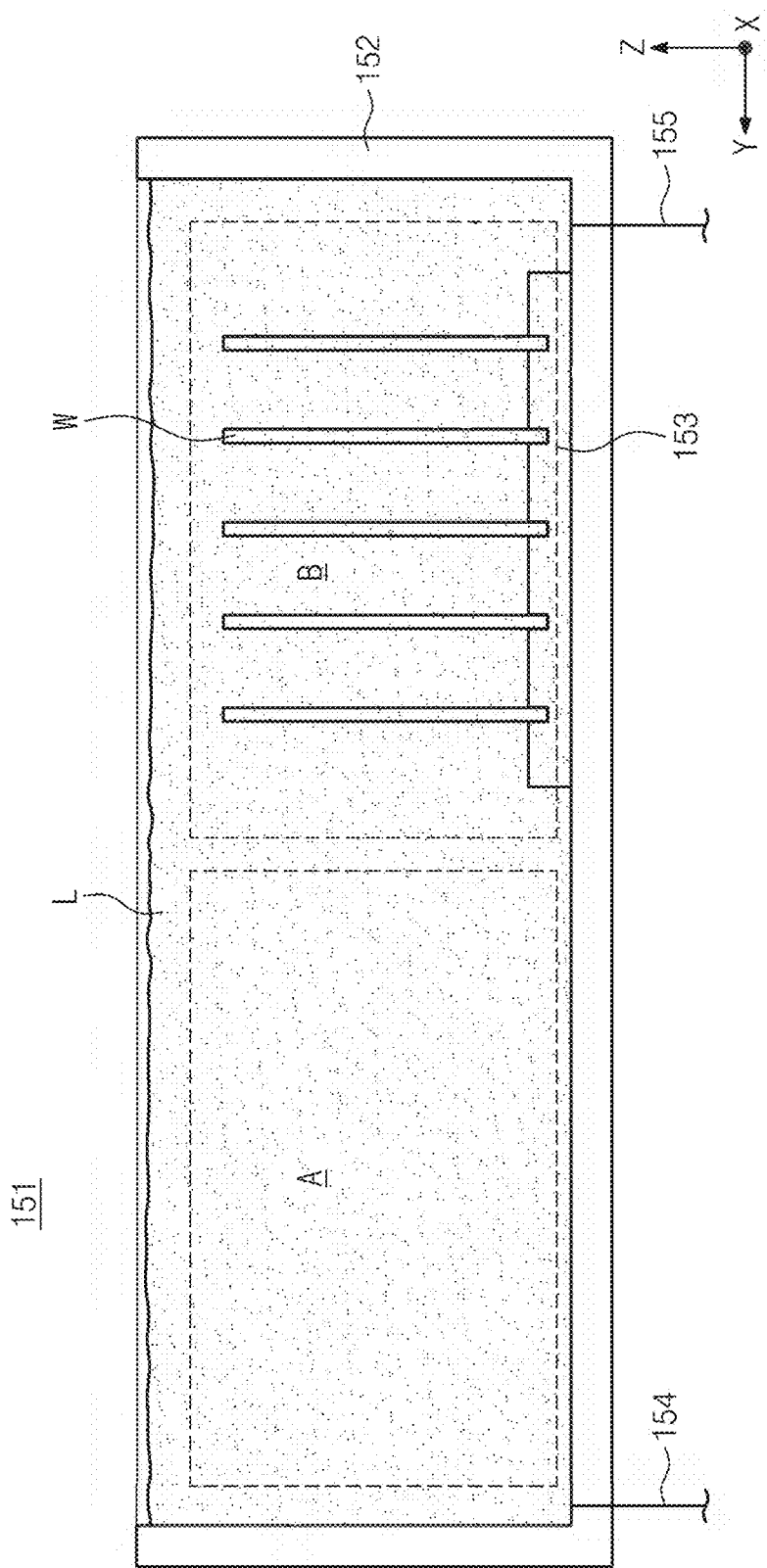
FIG. 9 is a plan view schematically illustrates a posture change treating bath of FIG. 1.

FIG. 9 illustrates a state of the posture change treating bath of FIG. 1.

Referring to FIG. 9, the posture change treating bath 151 may include a treating bath 152, a support member 153, a supply line 154, and a draining line 155.

The treating bath 152 may have a container shape with an open top. For example, the treating bath 152 may have a rectangular container shape with an open top. The treating bath 152 may have storage spaces A and B in which the treating liquid L may be stored. The treating liquid L stored in the treating bath 152 may be a liquid containing a water.

The support member 153 may be disposed in the storage spaces A and B to support the substrate W. The support member 153 may be configured to support a plurality of substrates W. For example, the support member 153 may be configured to support 50 substrates W. The support member 153 may be arranged so that a pair of rod-shaped bodies face each other, and a support groove (not shown) through which the substrate W can be supported is formed in each body.

The supply line 154 may supply the treating liquid L to the storage spaces A and B. The draining line 155 may drain the treating liquid L in the storage spaces A and B. A valve is installed in each of the supply line 154 and the draining line 155, and a level of the treating liquid L stored in the storage spaces A and B (that is, an amount of the treating liquid L stored in the storage spaces A and B) can be adjusted to a set level based on a liquid level of the treating liquid L sensed by a liquid level sensor (not shown).

In addition, the storage spaces A and B may include a first region and a second region. The first region and the second region may be positioned side by side when viewed from above. The first region may be provided as a support region A. The second region may be provided as a posture change region B. The support member is positioned at the support region A. The posture change robot 156 to be described later changes the posture of the substrate W at the posture change region B.

Referring back to FIG. 1, the posture change robot 156 may be disposed on a side of the posture change treating bath 151. The posture change robot 156 may be disposed between the posture change treating bath 151 and a standby chamber 210 to be described later.

The posture change robot 156 may include a hand 156-H and a joint portion 156-R. The hand 156-H may be coupled to the joint portion 156-R. The joint portion 156-R may change a position of the hand 156-H.

Figure 10:
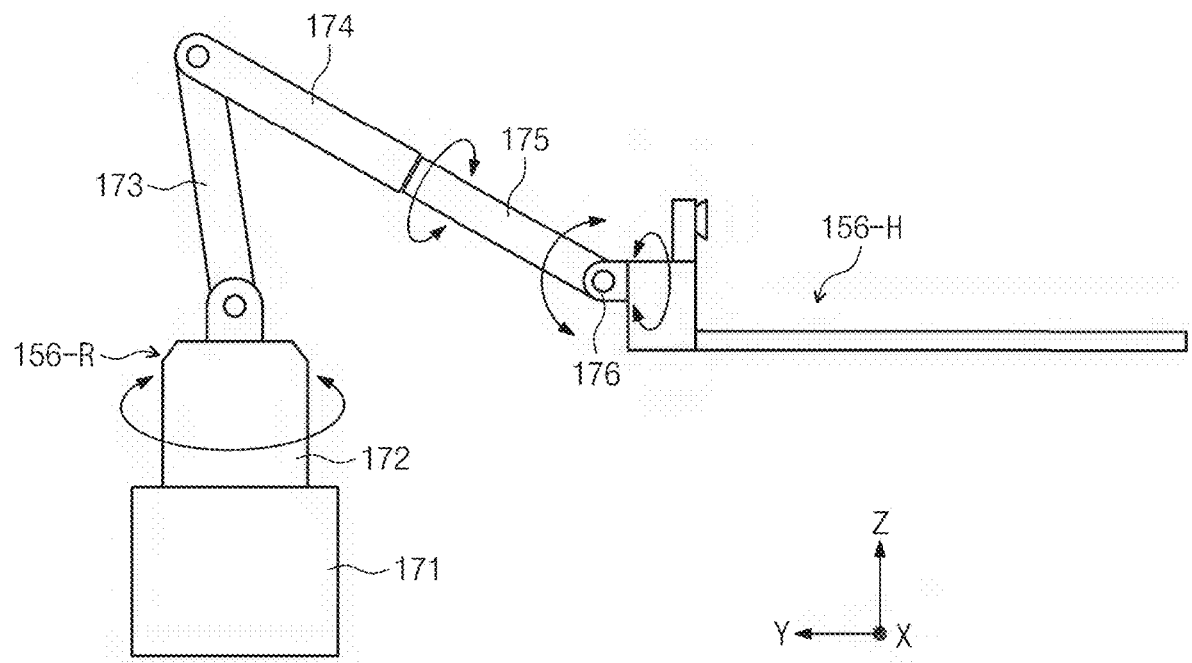
FIG. 10 schematically illustrates a posture change robot of FIG. 1.
Figure 11:
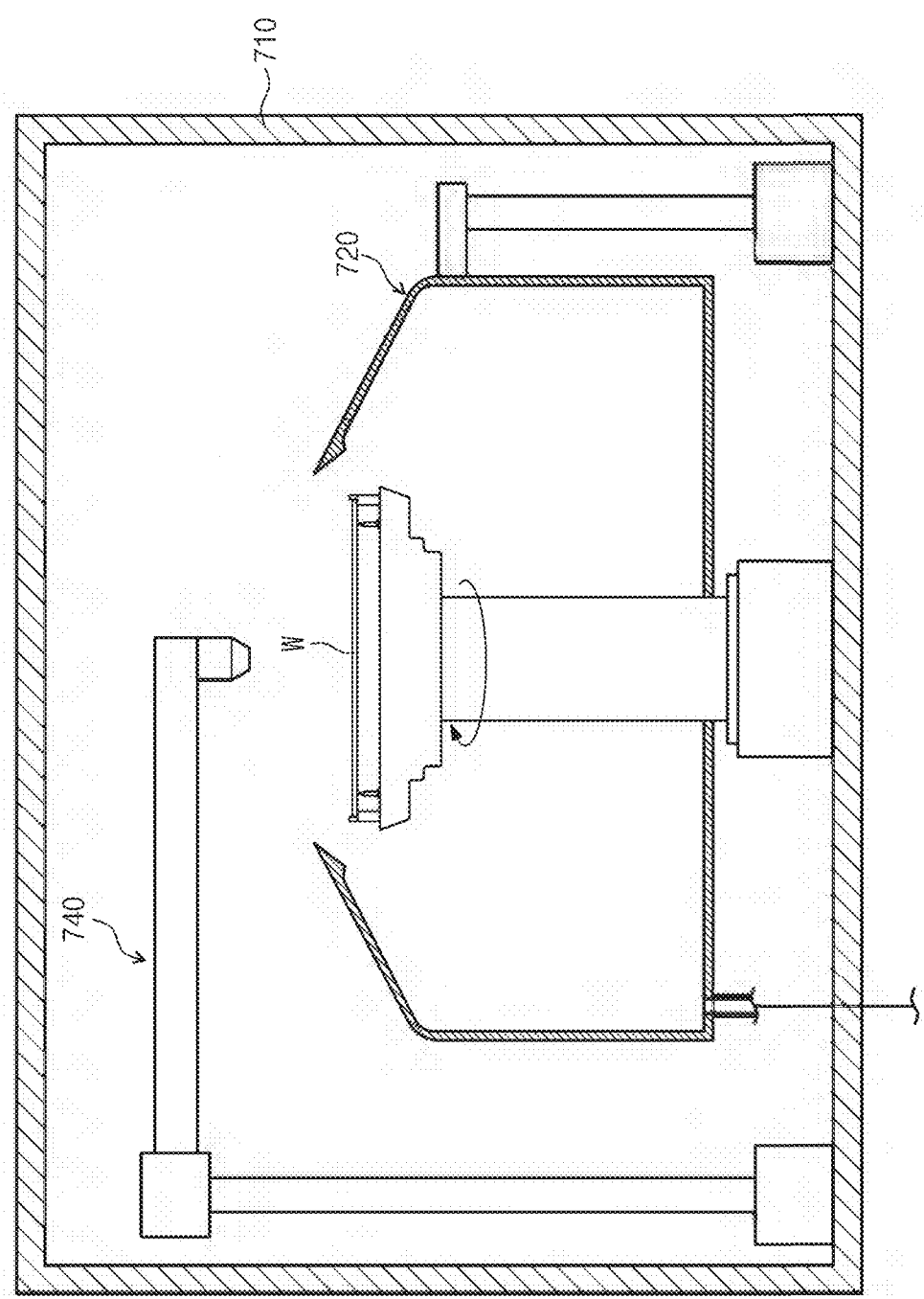
FIG. 11 schematically illustrates an atmosphere chamber of FIG. 1.

FIG. 10 schematically illustrates the posture change robot of FIG. 1. Referring to FIG. 10, the posture change robot 156 according to an embodiment of the inventive concept may change the posture of the substrate W from the vertical posture to the horizontal posture in the posture change treating bath 151 and transfer the substrate W which posture has changed to the horizontal posture to the standby chamber 210 of the second process treating unit 200. Also, the posture change robot 156 may be a multi-joint robot. The posture change robot 156 may be a six-axis multi-joint robot.

The joint portion 156-R may be a multi-joint arm composed of at least two or more axes. For example, the joint portion 156-R may be a 6-axis multi-joint arm. The joint portion 156-R may change the position of the hand 156-H by moving the hand 156-H in at least one of the first direction X, the second direction Y, and the third direction Z. In addition, the joint portion 156-R may rotate the hand 156-H based on one of the axes in the first direction X, the second direction Y, and the third direction Z.

The posture change robot 156 may include a base 171, a rotating body 172, a first arm 173, a second arm 174, a third arm 175, and a fourth arm 176.

The base 171 may be coupled to the rotating body 172. The rotating body 172 may rotate with respect to the base 171. The rotating body 172 may be rotated with a direction perpendicular to the ground as a rotation axis. The first arm 173 may be coupled to the rotating body 172. The first arm 173 may be rotated with respect to the rotation body with the horizontal direction as a rotation axis. The second arm 174 may be coupled to the first arm 173. The second arm 174 may be rotated with respect to the first arm 173 with the horizontal direction as a rotation axis. The third arm 175 may be coupled to the second arm 174. The third arm 175 may rotate around a lengthwise direction (or a lengthwise direction of the third arm 175) of the second arm 174. The fourth arm 176 may be rotated in a direction perpendicular to the lengthwise direction of the third arm 175. In addition, the fourth arm 176 may rotate the hand 156-H. For example, the fourth arm 176 may have a rotation shaft (not shown) capable of rotating the hand 156-H. The hand 156-H may be rotated in a direction perpendicular to a rotation axis of the fourth arm 176.

Referring back to FIG. 1, the second process treating unit 200 may treat the substrate W treated by the first process treating unit 100. The second process treating unit 200 may treat the substrate W treated by the first process treating unit 100, and may liquid treat or dry treat the substrate W in single-type manner.

The second process treating unit 200 may include a standby chamber 210, a first transfer chamber 220, a single-type liquid treating chamber 230, a drying chamber 240, a buffer unit 250, a second transfer chamber 260, and a second load port unit 270. Both the single-type liquid treating chamber 230 and the drying chamber 240 may be provided as single-type treating chambers which treating one substrate W at a time.

The first transfer chamber 220 is arranged with its lengthwise direction in the first direction. The single-type liquid treating chamber 230 and the drying chamber 240 is disposed at a side of the first transfer chamber 220. The single-type liquid treating chamber 230 and the drying chamber 240 are disposed along the first direction. A plurality of single-type liquid treating chambers 230 are provided, and they may be stacked in the vertical direction. In addition, a plurality of drying chambers 240 are provided, and they may be stacked in the vertical direction. According to an embodiment, the drying chamber 240 is disposed closer to the first process treating unit 100 than the single-type liquid treating chamber 230. The standby chamber 210 and the buffer unit 250 are disposed on the other side of the first transfer chamber 220. The standby chamber 210 and the buffer unit 250 are arranged along the first direction. The standby chamber 210 is disposed closer to the first process treating unit 100 than the buffer unit 250.

The second transfer chamber 260 is disposed on an opposite side to the first transfer chamber 220 with respect to the standby chamber 210 and the buffer unit 250. In addition, the second load port unit 270 is disposed on a side of the first transfer chamber 220. Due to the above-described arrangement, the drying chamber 240, the first transfer chamber 220, the standby chamber 210, the second transfer chamber 260, and the second load port unit 270 are sequentially arranged in the second direction.

The standby chamber 210 may provide a storage space for temporarily storing the substrate W. In the standby chamber 210, substrates W treated in the batch-type treating unit 140 may be posture changed by the posture change robot 156 in the posture change portion 150 and may be disposed on a transfer path of the substrate W transferred to the single-type liquid treating chambers 230, 240. That is, the standby chamber 210 may be disposed on the transfer path of the substrate W transferred between the batch-type treating unit 140 and the single-type liquid treating chambers 230 and 240.

The standby chamber 210 temporarily stores the substrate W. In addition, the standby chamber 210 maintains a wet state of the substrate W transferred by the posture change robot 156.

According to an embodiment, the standby chamber has a housing 710, a cup 720, a spin chuck 730, and a liquid supply unit 740.

The spin chuck 730 supports the substrate W. The substrate W is placed on the spin chuck 730 in a state parallel to the ground. The spin chuck 730 is provided to be rotatable based on its central axis. The liquid supply unit 740 supplies a wetting liquid to the substrate W supported by the spin chuck 730. The cup 720 is disposed to surround the spin chuck 730 in the housing 710. The cup 720 prevents a liquid from scattering to an entire region within the housing 710 while the liquid is supplied to the rotating substrate W.

While the substrate W stands by in the standby chamber 210, the wetting liquid is supplied from the liquid supply unit 740 to the substrate W to maintain the liquid film of the wetting liquid on the substrate W. This prevents the substrate W from being naturally dried before the substrate W is transferred to the single-type chambers 230 and 240.

The substrate W on which the liquid film is formed may be taken out from the standby chamber 210 by a first transfer robot 222 to be described later. The substrate W taken out from the standby chamber 210 may be transferred to the single-type liquid treating chambers 230 and 240 by the first transfer robot 222 to the single-type liquid treating chambers 230 and 240.

The first transfer chamber 220 may include a first transfer robot 222 and a transfer rail 223. The first transfer robot 222 may move along the transfer rail 223. A lengthwise direction of the transfer rail 223 may be parallel to the first direction X.

The single-type liquid treating chamber 230 may rotate the substrate W in a horizontal posture, but may supply the treating liquid to the rotating substrate W to treat the substrate W. The single-type liquid treating chamber 230 may treat the substrate W one by one. The treating liquid supplied from the single-type liquid treating chamber 230 may be an organic solvent. For example, the treating liquid supplied from the single-type liquid treating chamber 230 may be an isopropyl alcohol (IPA). In the single-type liquid treating chamber 230, the organic solvent may be supplied to the rotating substrate W, and the substrate W may be dried by rotating the substrate W. In contrast, the single-type liquid treating chamber 230 supplies the organic solvent to the rotating substrate W, and is transferred to the drying chamber 240 described later while the substrate W is wet with the organic solvent, so that the substrate W may be dried in the drying chamber 240.

Figure 12:
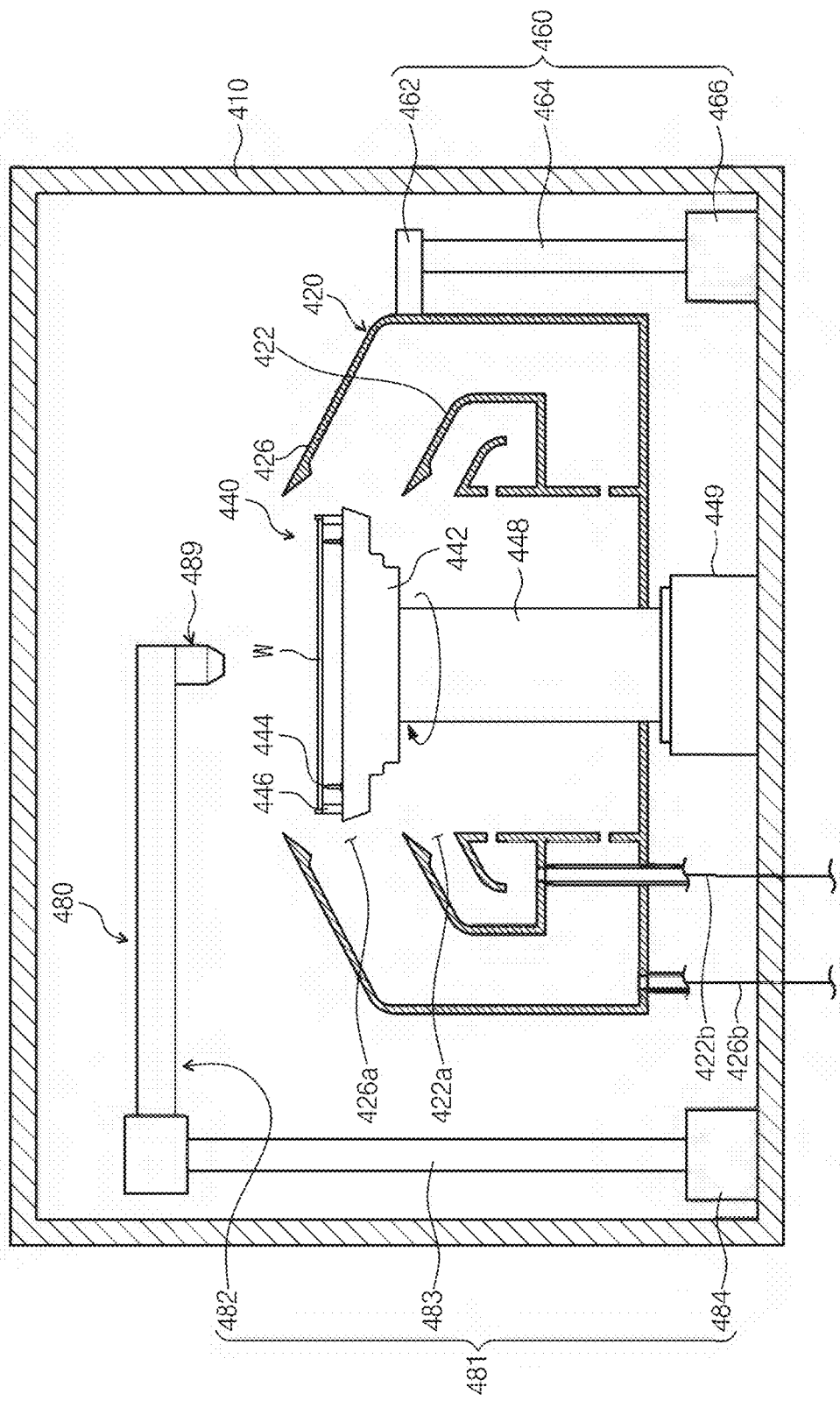
FIG. 12 schematically illustrates a liquid treating chamber of FIG. 1.

FIG. 12 schematically illustrates the single-type liquid treating chamber 230 of FIG. 1.

Referring to FIG. 12, the single-type liquid treating chamber 230 may include a housing 410, a cup 420, a support unit 440, a lifting/lowering unit 460, and a liquid supply unit 480.

The housing 410 has a treating space 412 therein. The housing 410 may have a container shape having a space therein. The treating space 412 of the housing 410 may be provided with a cup 420, a support unit 440, a lifting/lowering unit 460, and a liquid supply unit 480. The housing 410 may have a rectangular shape when viewed from a front cross section. However, the inventive concept is not limited thereto, and the housing 410 may be transformed into various shapes that may have a treating space 412.

The cup 420 has a container shape with an open top. The cup 420 has an inner recollecting container 422 and an outer recollecting container 426. Each of the recollecting containers 422 and 426 recollects different treating liquids from among the treating liquids used in the process. The inner recollecting container 422 is provided in an annular ring shape surrounding the substrate support unit 440, and the outer recollecting container 426 is provided in an annular ring shape surrounding the inner recollecting container 426. The inner space 422a and the inner recollecting container 422 of the inner recollecting container 422 function as the first inlet 422a through which the treating liquid flows into the inner recollecting container 422. A space 426a between the inner recollecting container 422 and the outer recollecting container 426 functions as a second inlet 426a through which the treating liquid flows into the outer recollecting container 426. According to an embodiment, each of the inlet 422a and 426a may be positioned at different heights.

The recollecting lines 422b and 426b are connected below the bottom surfaces of each of the recollecting containers 422 and 426. The treating liquids which are introduced into each of the recollecting containers 422 and 426 may be provided to an outer treating liquid regeneration system (not shown) through the recollecting lines 422b and 426b and reused.

The support unit 440 supports the substrate W in the treating space 412. The support unit 440 supports and rotates the substrate W during the process. The support unit 440 has a support plate 442, a support pin 444, a chuck pin 446, and rotation driving members 448 and 449.

The support plate 442 is generally provided in a circular plate shape and has a top surface and a bottom surface. The bottom surface has a smaller diameter than the top surface. That is, the support plate 442 may have a shape of a wide top surface and a narrow bottom surface. The top and bottom surfaces are positioned so that their central axes coincide with each other. In addition, a heating means (not shown) may be provided on the support plate 442. The heating means provided to the support plate 442 may heat the substrate W placed on the support plate 442. The heating means may generate a heat. The heat generated by the heating means may be warm or cold. The heat generated by the heating means may be transferred to the substrate W placed on the support plate 442. In addition, the heat transferred to the substrate W may heat the treating liquid supplied to the substrate W. The heating means may be a heater and/or a cooling coil. However, the inventive concept is not limited thereto, and the heating means may be variously modified into a known device.

A plurality of support pins 444 are provided. The support pins 444 are disposed to be spaced apart from an edge of the top surface of the support plate 442 at a predetermined interval and upwardly protrude from the support plate 442. The support pins 444 are disposed to have an annular ring shape as a whole by a combination with each other. The support pin 444 supports a rear edge of the substrate W such that the substrate W is spaced apart from a top surface of the support plate 442 by a predetermined distance.

A plurality of chuck pins 446 are provided. The chuck pin 446 is disposed to be farther from a center of the support plate 442 than the support pin 444. The chuck pin 446 is provided to upwardly protrude from the top surface of the support plate 442. The chuck pin 446 supports a side of the substrate W so that the substrate W does not deviate from a correct position in a lateral direction when the support plate 442 is rotated. The chuck pin 446 is provided to be able to move linearly between an outer position and an inner position along a radial direction of the support plate 442. The outer position is a position far from a center of the support plate 442 compared to the inner position. If the substrate W is loaded or unloaded on the support plate 442, the chuck pin 446 is positioned at the outer position, and if the process is performed on the substrate W, the chuck pin 446 is positioned at the inner position. The inner position is a position at which the side parts of the chuck pin 446 and the substrate W contact each other, and the outer position is a position at which the chuck pin 446 and the substrate W are spaced apart from each other.

The rotation driving members 448 and 449 rotate the support plate 442. The support plate 442 may be rotated about a magnetic center axis by the rotation driving members 448 and 449. The rotation driving members 448 and 449 include a support shaft 448 and a driving unit 449. The support shaft 448 has a container shape facing a fourth direction 16. A top end of the support shaft 448 is fixedly coupled to the bottom surface of the support plate 442. According to an embodiment, the support shaft 448 may be fixedly coupled to the center of the bottom surface of the support plate 442. The driving unit 449 provides a driving force to rotate the support shaft 448. The support shaft 448 may be rotated by the driving unit 449, and the support plate 442 may be rotated together with the support shaft 448.

The lifting/lowering unit 460 linearly moves the cup 420 in the vertical direction. As the cup 420 moves up and down, a relative height of the cup 420 with respect to the support plate 442 is changed. In the lifting/lowering unit 460, the cup 420 is lowered so that the support plate 442 protrudes above the cup 420 when the substrate W is loaded or unloaded on the support plate 442. In addition, if the process proceeds, a height of the cup 420 is adjusted so that the treating liquid can flow into a preset recollecting container 422, 426 according to the type of the treating liquid supplied to the substrate W. The lifting/lowering unit 460 has a bracket 462, a moving shaft 464, and a driver 466. The bracket 462 is fixedly installed on an outer wall of the cup 420, and the moving shaft 464, which is moved in the vertical direction by the driver 466, is fixedly coupled to the bracket 462. Selectively, the lifting/lowering unit 460 may move the support plate 442 in the vertical direction.

The liquid supply unit 480 may supply the treating liquid to the substrate W. The treating liquid may be an organic solvent, a chemical or a rinsing liquid described above. The organic solvent may be an isopropyl alcohol (IPA) liquid.

The liquid supply unit 480 may include a moving member 481 and a nozzle 489. The moving member 481 moves the nozzle 489 to a process position and a standby position. The process position is a position at which the nozzle 489 faces the substrate W supported by the support unit 440. According to an embodiment, the process position is a position at which the treating liquid is discharged to a top surface of the substrate W. Also, the process position also includes a first supply position and a second supply position. The first supply position may be a position closer to the center of the substrate W than the second supply position, and the second supply position may be a position including an end part of the substrate W. Selectively, the second supply position may be a region adjacent to the end of the substrate W. The standby position is defined as a position at which the nozzle 489 is out of the process position. According to an embodiment, the standby position may be a position at which the nozzle 489 stands by before or after a process treatment is completed on the substrate W.

The moving member 481 includes an arm 482, a support shaft 483, and a driver 484. The support shaft 483 is positioned on a side of the cup 420. The support shaft 483 has a rod shape in which a lengthwise direction thereof faces the fourth direction. The support shaft 483 is provided to be rotatable by the driver 484. The support shaft 483 is provided to be movable up and down. The arm 482 is coupled to the top end of the support shaft 483. The arm 482 vertically extends from the driver 484. A nozzle 489 is coupled to an end of the arm 482. As the support shaft 483 is rotated, the nozzle 489 may swing together with the arm 482. The nozzle 489 may be swing-moved to the process position and the standby position. Selectively, the arm 482 may be provided to be forwardly and backwardly movable in the lengthwise direction thereof. A path through which the nozzle 489 moves when viewed from above may coincide with the central axis of the substrate W at the process position.

The drying chamber 240 may remove the organic solvent remaining on the substrate W by using the drying fluid G in a supercritical state. The drying chamber 240 may be a high-pressure chamber which removes the organic solvent remaining on the substrate W using a supercritical fluid. The drying fluid may be a carbon dioxide ($CO_2$).

The substrate W treated in the single-type treating chambers 230 and 240 may be transferred to the buffer unit 250 by the first transfer robot 222. The buffer unit 250 may be disposed between the first transfer chamber 220 and the second transfer chamber 260. The buffer unit 250 may be disposed between the single-type treating chambers 230 and 240 and the second load port unit 270.

The buffer unit 250 may provide a space in which the substrate W is temporarily stored similarly to the standby chamber 210. For example, the buffer unit 250 may temporarily store the substrate W treated in the single-type liquid treating chamber 230 and/or the single-type drying chamber 240 which are single-type treating chambers.

The second transfer chamber 260 may be disposed between the buffer unit 250 and the second load port unit 270. A second transfer robot 262 may be provided in the second transfer chamber 260. The second transfer robot 262 may complete the treatment and transfer the substrate W stored in the buffer unit 250 to the transfer container F.

The hand of the second transfer robot 262 may be a single-type hand for transferred the substrate W one by one. A transfer hand of the second transfer robot 262 may be provided to be movable along the first direction X, the second direction Y, and the third direction Z. In addition, the transfer hand of the second transfer robot 262 may be rotatably provided with the third direction Z as a rotation axis.

The second load port unit 270 may include at least one load port. A transfer container F capable of storing a plurality of substrates W may be placed on the load port of the second load port unit 270. For example, the transfer container F placed in the second load port unit 270 may store substrates W treated by the first process treating unit 100 and the second process treating unit 200. The transfer container F placed in the second load port unit 270 may store only the substrates W on which a treatment has been completed in the first process treating unit 100 and the second process treating unit 200. That is, the second load port unit 270 may perform a function of unloading the treated substrate W from the substrate treating apparatus.

The second transfer robot 262 described above may take the treated substrate W into the container F placed in the load port of the second load port unit 270. The container F may be transferred to an outside of the substrate treating apparatus 10 by the above-described article transfer apparatus (e.g., OHT).

The controller 600 may control the substrate treating apparatus 10. For example, the controller 600 may control components of the substrate treating apparatus 10. For example, the controller 600 may control the substrate treating apparatus 10 so that the substrate treating apparatus 10 may perform a process of treating the substrate W.

For example, the controller 600 may control at least one of the first load port unit 110, the index chamber 120, the transfer unit 130, the batch-type treating unit 140, the posture change portion 150, the standby chamber 210, the first transfer chamber 220, the single-type liquid treating chamber 230, the single-type drying chamber 240, and the second transfer chamber 260.

The controller 600 may comprise a process controller consisting of a microprocessor (computer) that executes a control of the substrate treating apparatus 10, a user interface such as a keyboard via which an operator inputs commands to manage the substrate treating apparatus 10, and a display showing the operation situation of the substrate treating apparatus, and a memory unit storing a treating recipe, i.e., a control program to execute treating processes of the substrate treating apparatus 10 by controlling the process controller or a program to execute components of the substrate treating apparatus 10 according to data and treating conditions. In addition, the user interface and the memory unit may be connected to the process controller. The treating recipe may be stored in a storage medium of the storage unit, and the storage medium may be a hard disk, a portable disk, such as a CD-ROM or a DVD, or a semiconductor memory, such as a flash memory.

Figure 13:
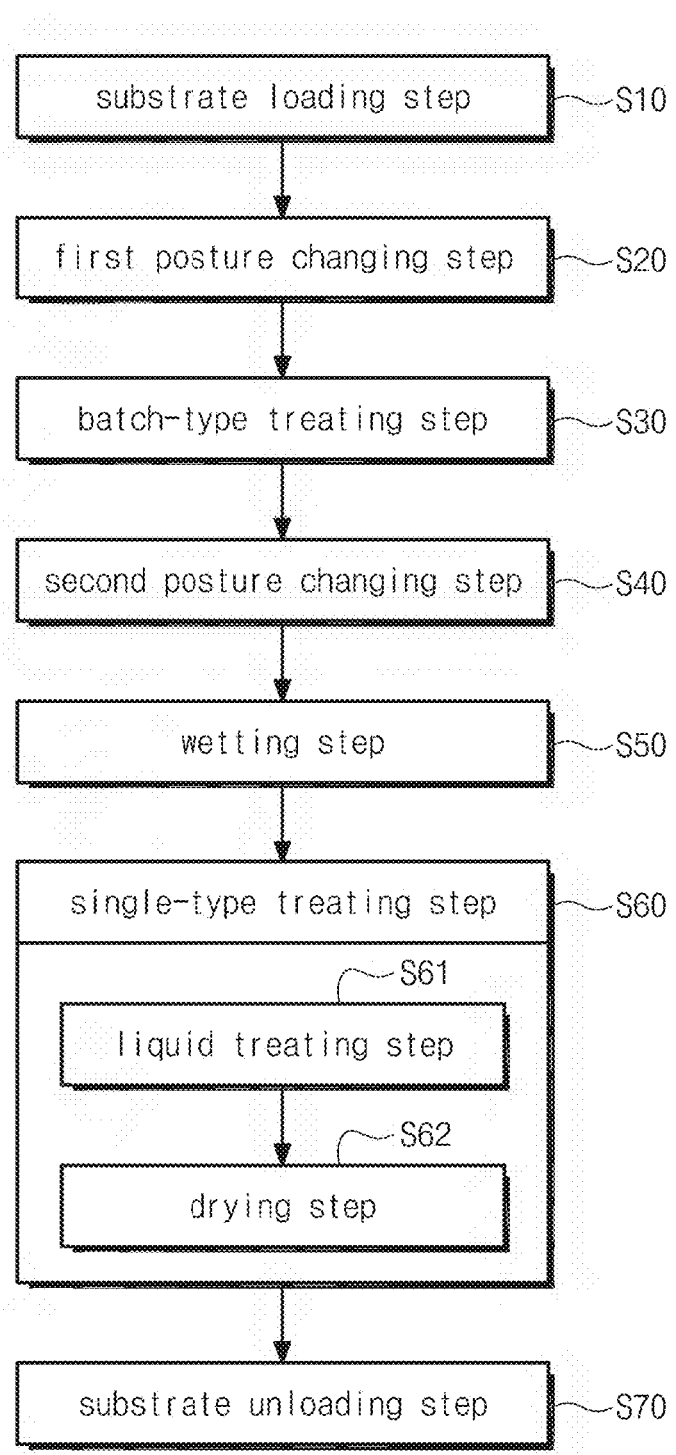
FIG. 13 is a flowchart illustrating a substrate treating method according to an embodiment of the inventive concept.

FIG. 13 is a flowchart illustrating a substrate treating method according to an embodiment of the inventive concept.

Referring to FIG. 13, the substrate treating method according to an embodiment of the inventive concept may include a substrate loading step S10, a first posture changing step S20, a batch-type treating step S30, a second posture changing step S40, a wetting step S50, a single-type treating step S60, and a substrate unloading step S70.

In the substrate loading step S10, a so-called substrate W in an untreated state, which requires a treatment, may be loaded on the substrate treating apparatus 10. In the substrate loading step S10, the transfer container F may be placed on the first load port unit 110.

The substrate W stored in the transfer container F may be taken out by the index robot 122 and transferred to the storage container C.

In the first posture change step S20, the posture of the substrate W may be changed from a horizontal posture to a vertical posture. In the first posture change step S20, the posture of the substrate W may be changed as the storage container C rotates in the first direction X around the axis by the posture change unit 124. The posture change unit 124 may have a rotation shaft capable of rotating the storage container C in the first direction X as an axis. In the first posture change step S20, postures of the plurality of substrates W may be changed at once.

The substrate W changed to the vertical posture may be transferred to the first batch-type treating unit 141 by the first transfer unit 132.

In the batch-type treating step S30, a liquid treatment may be performed on the plurality of substrates W in the vertical posture. In the batch-type treating step S30, the substrates W may be transferred to at least one of the batch-type treating baths 141a to 143b to perform the liquid treatment on the substrate W. The batch-type treating step S30 may be performed in a manner in which the substrate is pre-treated at the first batch-type treating unit 141 and post-treated at the second batch-type treating unit 142 or the third batch-type treating unit 143.

For example, the substrate W transferred to the first batch-type treating unit 141 may be liquid-treated in the first chemical bath 141a and/or the first rinsing bath 141b. The substrate W which is liquid-treated in the first chemical bath 141a and/or the first rinsing bath 141b may be transferred to any one of the treating units selected from the second batch-type treating unit 142 or the third batch-type treating unit 143. In the first chemical bath 141a, the substrate W may be treated with a chemical such as a DHF (an embodiment of a first chemical), and in the first rinsing bath 141-B2, the substrate W may be treated with a rinsing liquid such as a water.

For example, if the substrate W is transferred to the second batch-type treating unit 142, the substrate W may be treated firstly by a chemical containing a phosphoric acid (an embodiment of a second chemical) in the second chemical bath 142*a*, and then by a rinse-treated by a rinsing liquid containing a water in the second rinsing bath 142*b*.

The rinse-treated substrates W may be transferred to the posture change treating bath 151 by the second transfer unit 134.

The second posture changing step S40 may be performed by the posture change portion 150. The second posture changing step S40 may include a grip step of gripping the substrate W and a rotation step of changing the posture of the substrate W. In the second posture changing step S40, the posture of the substrate W may be changed one by one.

After the second posture changing step S40 is performed, the wetting step S50 may be performed. The wetting step S50 may be performed between the second posture changing step S40 and the single-type treating step S60.

The wetting step S50 may be performed by the posture change robot 156 and/or the standby chamber 210. In the wetting step S50, a natural drying of the substrate W may be prevented by spraying the wetting liquid to the substrate W exposed to the outside away from the treating liquid L. The wetting liquid may be the same kind of liquid as the treating liquid L stored in the aforementioned posture change treating bath 151. Unlike this, the wetting liquid may be a different type of liquid from the aforementioned treating liquid.

In addition, the wetting step S50 may be performed in the standby chamber 210 as described above. The posture change robot 156 transfers the substrate W to the standby chamber 210 after performing the second posture change step S40 on the substrate W. In the wetting step S50, if the substrate W is taken into the standby chamber 210, the liquid supply unit 740 may supply the wetting liquid to the substrate W.

As the wetting step S50 is performed, it is possible to minimize a natural drying of the substrate W before being taken into the single-type chambers 230 and 240.

In the single-type treating step S60, a treatment may be performed on a single substrate W in a horizontal posture. The single-type treating step S60 may include a liquid treating step S61 and a drying step S62.

In the liquid treating step S61, the substrate W may be liquid-treated in a single-type-like manner. The liquid treating step S61 may be performed in the single-type liquid treating chamber 230 if the substrate W temporarily stored in the standby chamber 210 is transferred to the single-type liquid treating chamber 230. An organic solvent such as an IPA may be supplied onto the substrate W at the liquid treating step S40.

In the drying step S62, the substrate W may be dried in a single-type manner. The drying step S62 may be performed in the drying chamber 240 if the liquid-treated substrate W in the liquid treating step S61 is transferred to the drying chamber 240. In the drying step S50, a supercritical treating fluid (e.g., supercritical carbon dioxide) may be supplied to the substrate W to remove an organic solvent, a wetting liquid, or a treating liquid L remaining on the substrate.

In some cases, the drying step S50 is not performed in the drying chamber 240, and the substrate W may be dried by rotating the substrate W at a high speed in the single-type liquid treating chamber 230 (so-called spin drying).

In the substrate unloading step S70 performed after the single-type treating step S60, the substrate W on which the single-type treating step S60 is performed may be transferred to the buffer unit 250, then transferred to the transfer container F placed on the second load port unit 270 by the second transfer robot 262 of the second transfer chamber 260, and the transfer container F placed on the second load port unit 270 may be gripped by a transfer apparatus such as an OHT to be unloaded from the substrate treating apparatus 10.

Figure 14:
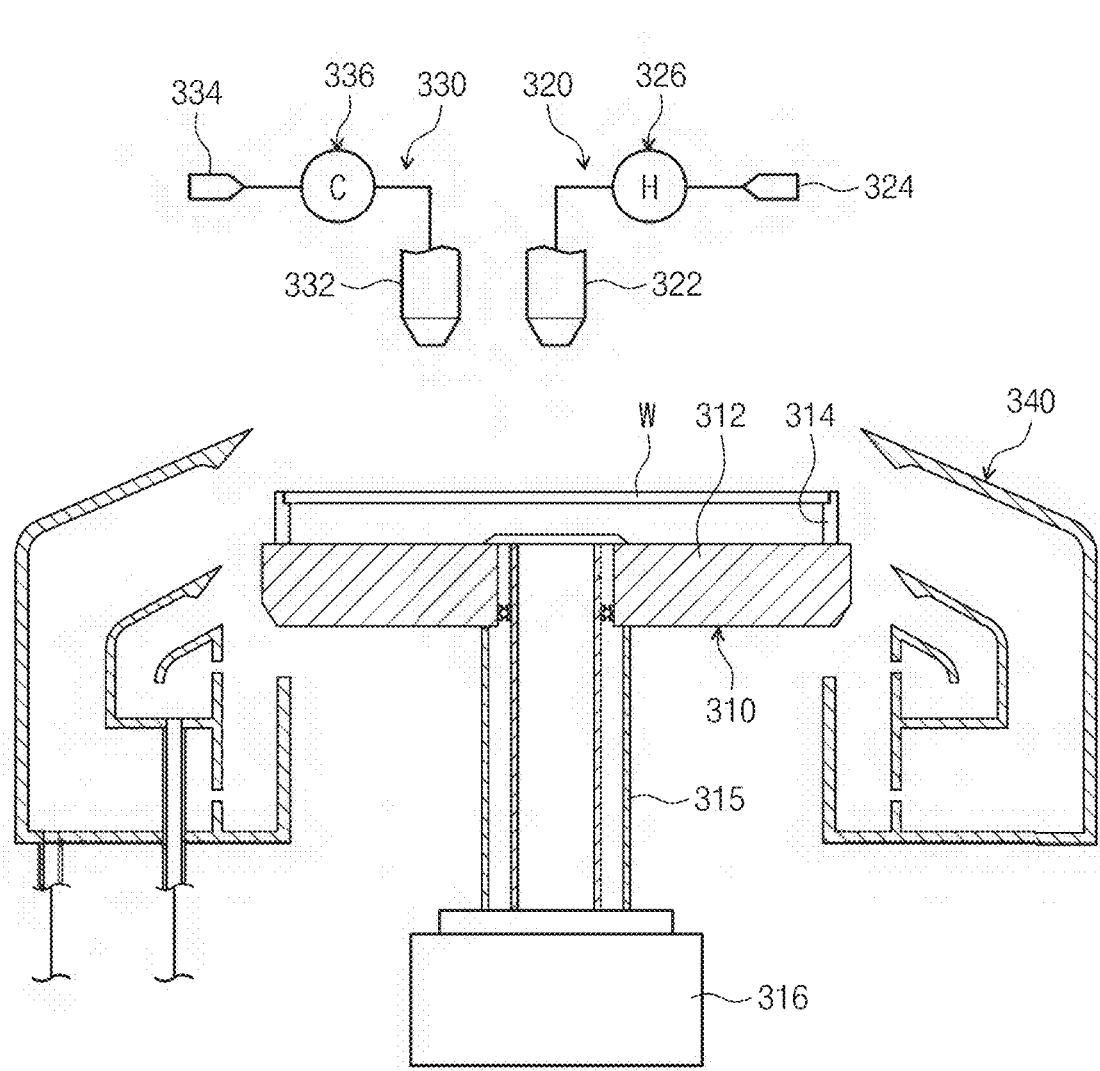
FIG. 14 schematically illustrates another embodiment of a liquid treating chamber of the inventive concept.

FIG. 14 is another embodiment of the liquid treating chamber of the inventive concept.

In the above-described example, it has been described that the liquid treating chamber is provided as the batch-type treating unit. However, unlike this, the liquid treating chamber may be provided as a single-type treating unit for treating the substrate W one by one. FIG. 14 illustrates an example in which the liquid treating chamber is provided as a single-type treating unit.

The single-type treating unit 300 according to FIG. 14 has a support unit 310, a first treating liquid supply unit 320, a second treating liquid supply unit 330, and a cup 340.

The single-type treating unit 300 has a treating space therein. The single-type treating unit 300 may have a container shape having a space therein. The support unit 310, the first treating liquid supply unit 320, the second treating liquid supply unit 330, and the cup 340 may be provided in an inner space of the single-type treating unit 300.

The support unit 310 supports the substrate W in the treating space. The support unit 310 may support and rotate the substrate W during the process. The support unit 310 includes a spin chuck 312, a support pin 314, and rotation driving members 315 and 316.

The spin chuck 312 is generally provided in a circular plate shape and has a top surface and a bottom surface. The bottom surface has a smaller diameter than the top surface. That is, the spin chuck 312 may have a shape having a wide top surface and a narrow bottom surface. The top surface and the bottom surface are positioned so that their central axes coincide with each other. In addition, a heating means (not shown) may be provided on the spin chuck 312. The heating means provided to the spin chuck 312 may heat the substrate W placed on the spin chuck 312. Thereby, the treating liquid supplied onto the substrate W may be heated.

A support pin 314 may be installed on the spin chuck 312. The support pin 314 may support and chuck the bottom surface and/or the side surface of the substrate W. The support pin 314 may be provided to be movable in a lateral direction by a pin moving mechanism not shown.

The rotation driving members 315 and 316 rotate the spin chuck 312. The spin chuck 312 is rotatable about a magnetic central axis by the rotation driving members 315 and 316. The rotation driving members 315 and 316 include a rotation shaft 315 and a driving unit 316. The rotation shaft 315 has a container shape. A top end of the rotation shaft 315 is fixedly coupled to a bottom surface of the spin chuck 312. According to an embodiment, the rotation shaft 315 may be fixedly coupled to a center of the bottom surface of the spin chuck 312. The driving unit 316 provides a driving force to rotate the rotation shaft 315. The rotation shaft 315 is rotated by the driving unit 316, and the spin chuck 312 is rotatable together with the rotation shaft 315.

The first treating liquid supply unit 320 supplies the first treating liquid to the substrate W. The first treating liquid may be a chemical. According to an embodiment, the chemical may be a phosphoric acid solution. The second treating liquid supply unit 330 supplies the second treating liquid to the substrate W. The second treating liquid may be a rinsing liquid. The rinsing liquid can be a water. For example, the rinsing liquid may be a pure water.

The first treating liquid supply unit 320 may include a first nozzle 322, a first treating liquid supply source 324, and a heater 326. The first nozzle 322 supplies the first treating liquid to the top surface of the substrate W. The first treating liquid supply source 324 stores the first treating liquid and supplies the first treating liquid to the first nozzle 322. The first nozzle 322 receiving the first treating liquid from the first treating liquid supply source 324 discharges the first treating liquid to the substrate W. The first nozzle 322 may be provided to be movable in a vertical direction and/or a lateral direction by a nozzle moving mechanism not shown. The heater 326 may heat a supply temperature of a discharged phosphoric acid solution to a set temperature.

The second treating liquid supply unit 330 may include a second nozzle 332, a second treating liquid supply source 334, and a cooler 336. The second nozzle 332 and the second treating liquid supply source 334 have the same structure and role as the first nozzle 322 and the first treating liquid supply source 324 of the first treating liquid supply unit 320. The cooler 336 may cool the discharged pure water to a set temperature. The set temperature may be a temperature lower than the freezing point of the phosphoric acid solution.

The cup 340 has a container shape with an open top. The cup 340 may recollect the first treating liquid and the second treating liquid. The cup 340 may be configured to separately recollect the first treating liquid supplied by the first treating liquid supply unit 320 and the second treating liquid supplied by the second treating liquid supply unit 330. In addition, the cup 340 may prevent the treating liquid supplied by the first treating liquid supply unit 320 and the second treating liquid supply unit 330 from being scattered to the outside.

In the treating apparatus according to the embodiment, the first treating liquid supply unit 320 supplies the phosphoric acid solution to the treating space to treat the substrate W. In this case, the phosphoric acid solution is supplied to the treating space in a state of being heated by the heater 326 of the first treating liquid supply unit 320.

If the phosphoric acid solution treatment is completed, the phosphoric acid solution is recollected through the cup 340.

If the recollecting of the phosphoric acid solution is completed, the second treating liquid supply unit 330 supplies the pure water to the treating space to treat the substrate W. In this case, the pure water is supplied to the storage space at a temperature lower than the freezing point of the phosphoric acid solution supplied to the treating space. The pure water may be cooled and provided by the cooler 336 of the second treating liquid supply unit 330.

If the pure water at a temperature lower than the freezing point of the phosphoric acid solution is used, a removal rate of phosphoric acid particle remaining on the substrate W after a treatment with the phosphoric acid solution is improved. It will be described in detail with reference to FIG. 15 and FIG. 16.

Figure 15:
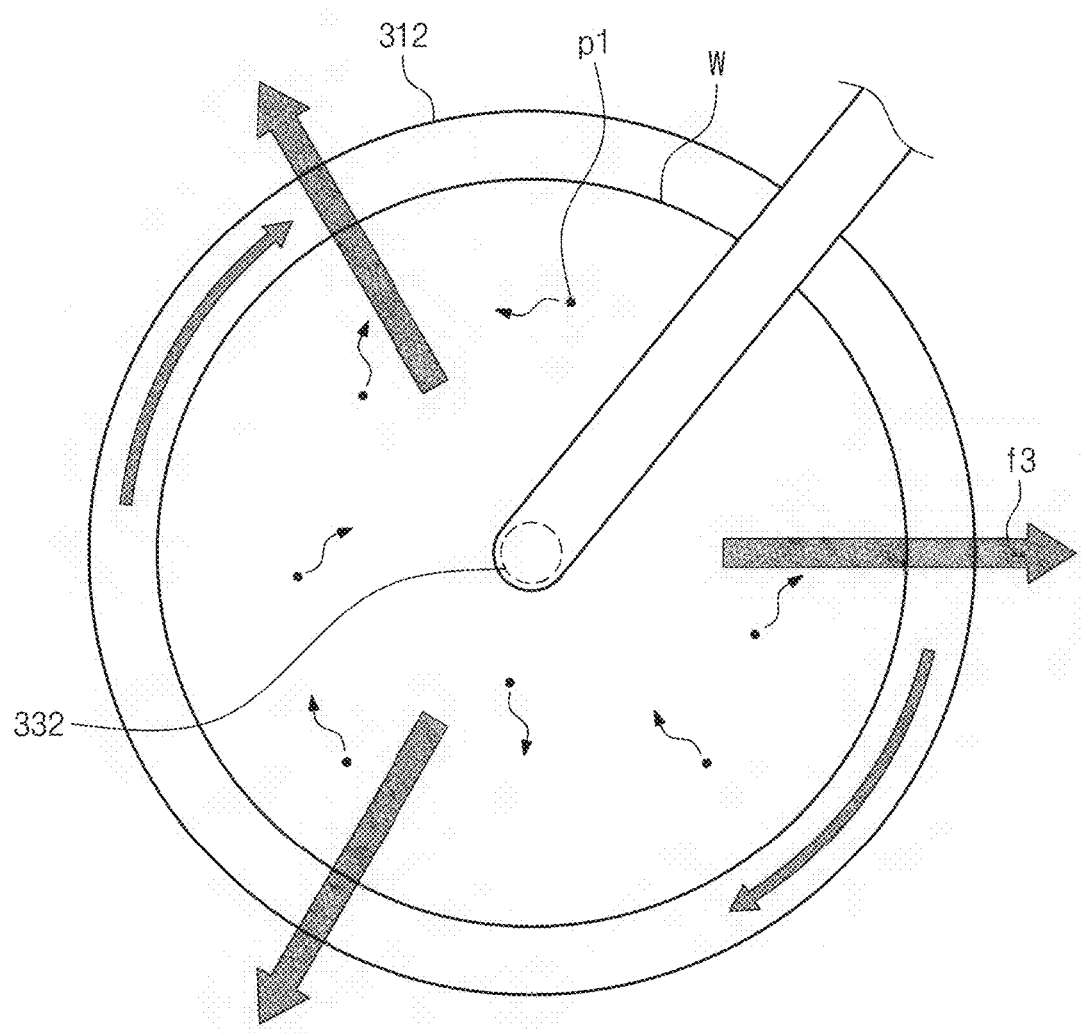
FIG. 15 schematically illustrates the flow of the pure water and particles in a treating space if the a substrate is rinsed by a single-type treating unit in a conventional manner.

FIG. 15 schematically illustrates a movement of the phosphoric acid particle positioned on the substrate W if the temperature of the pure water is set to a temperature higher than the freezing point of the phosphoric acid solution supplied through the first treating liquid supply unit 320.

If the pure water is supplied to the substrate W placed on the spin chuck 312, the pure water is discharged to the substrate W and then flows to the outside of the substrate W by a centrifugal force according to the rotation of the substrate W. Using this flow of the pure water, the phosphate particle is removed from the substrate W.

Referring to FIG. 15, even while supplying the pure water, the phosphate particle p1 is not easily separated from the substrate W. In addition, the phosphate particle p1 away from the substrate W does not flow outside the substrate W, but are scattered over the substrate W and adsorbed back to the substrate W.

Since the phosphate particle p1 is a microparticle, they drift mainly by a Brownian motion. That is, it may move irregularly due to a collision between molecules in the treating space. The small phosphate particles p1 drift in the treating space under an influence of this Brownian motion.

Therefore, as shown in FIG. 15, a direction of a movement of the pure water f3 and a direction of a movement of a phosphate particle p1 by a centrifugal force do not match, and the phosphate particle p1 remains on a surface of the substrate W in the treating space even while pure water is bounced out of the substrate W and recollected through the cup 340.

Figure 16:
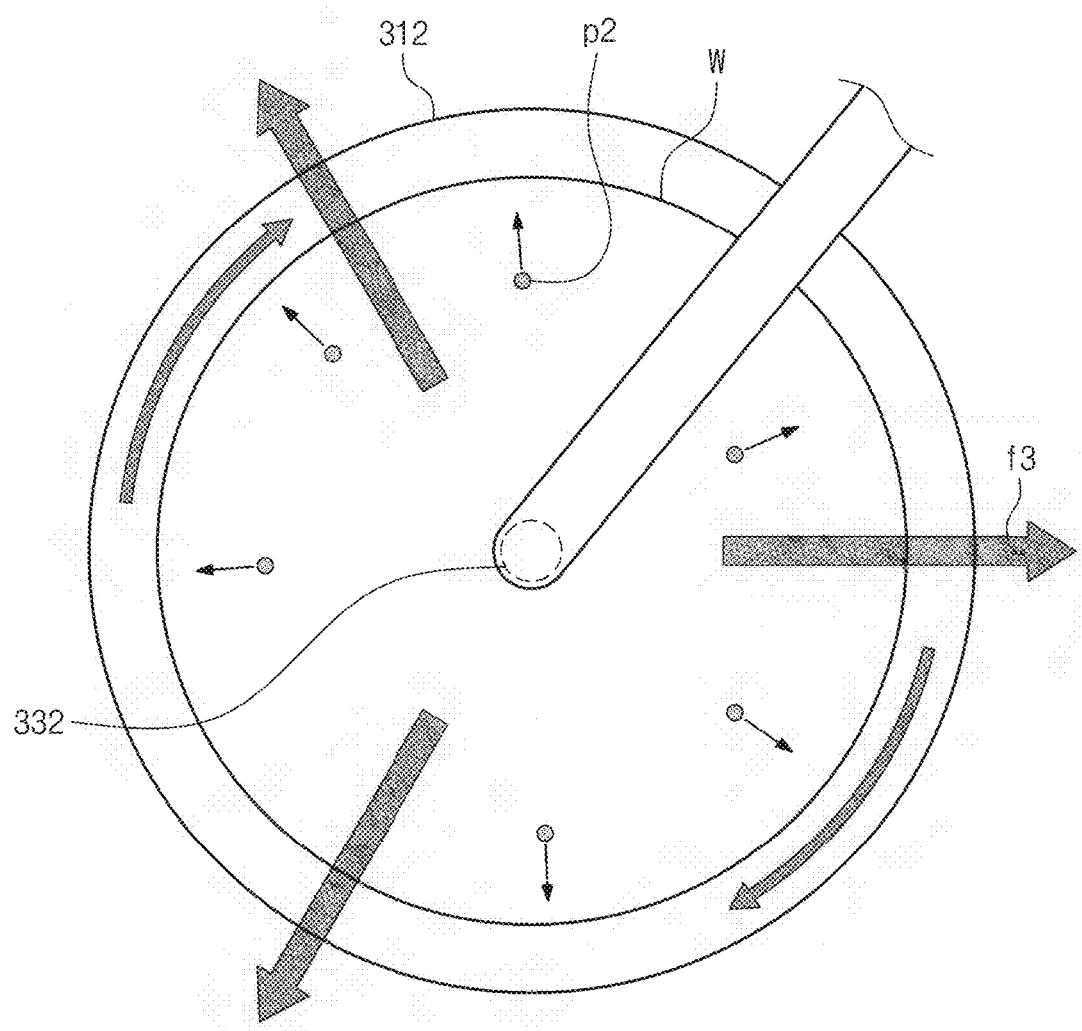
FIG. 16 schematically illustrates the flow of pure water and particles in the treating space if the substrate is rinsed in the treating space of FIG. 14.

FIG. 16 schematically shows the movement of the phosphate particle on the substrate W if the pure water is supplied at a temperature lower than the freezing point of the phosphoric acid solution.

Referring to FIG. 16, if the pure water is supplied at a temperature lower than the freezing point of the phosphoric acid solution, the phosphate particle p2 moves along the flow of pure water.

The phosphate particle p2 undergoes a nucleation reaction at a temperature lower than the freezing point. The nucleation reaction produces a crystal nucleus of the phosphate particle p2. Thereby, the phosphate particle p2 grows. As the phosphoric acid particle p2 becomes larger, an influence of the Brownian motion decreases and is influenced dominantly by the physical force.

Therefore, the crystallized phosphate particle p2 may behave depending on a physical force. The physical force may be, for example, a flow of pure water. The physical force may also be a centrifugal force. That is, the crystallized phosphate particle p2 can be removed by following the movement of pure water f3 as shown in FIG. 16 and being bounced off the substrate W by the centrifugal force.

In the above example, as pure water is cooled and supplied at a lower temperature, even smaller phosphate particles p2 may be easily crystallized.

The effects of the inventive concept are not limited to the above-mentioned effects, and the unmentioned effects can be clearly understood by those skilled in the art to which the inventive concept pertains from the specification and the accompanying drawings.

Although the preferred embodiment of the inventive concept has been illustrated and described until now, the inventive concept is not limited to the above-described specific embodiment, and it is noted that an ordinary person in the art, to which the inventive concept pertains, may be variously carry out the inventive concept without departing from the essence of the inventive concept claimed in the claims and the modifications should not be construed separately from the technical spirit or prospect of the inventive concept.

What is claimed is:
1. A substrate treating method comprising:
liquid treating a substrate with a first treating liquid; and
replacing the first treating liquid on the substrate with a second treating liquid,
wherein the replacing the first treating liquid with a second treating liquid includes providing the second treating liquid at a temperature lower than a freezing point of the first treating liquid.
2. The substrate treating method of claim 1, wherein the second treating liquid includes a water, and the replacing includes cooling the second treating liquid and then supplying the second treating liquid to the substrate.

3. The substrate treating method of claim 2, wherein
the first treating liquid includes a phosphoric acid solution, and
the liquid treating the substrate includes heating the first treating liquid and then supplied to the substrate.

4. The substrate treating method of claim 2, wherein
the liquid treating includes immersing a plurality of substrates within a first treating bath filled with the first treating liquid, and
the replacing the first treating liquid includes immersing the plurality of substrates within a second treating bath filled with the second treating liquid.

5. The substrate treating method of claim 4, further comprising:
drying the plurality of substrates one by one using a supercritical fluid after the replacing the first treating liquid.

6. The substrate treating method of claim 5, further comprising:
replacing the second treating liquid on a plurality of substrates one by one with an organic solvent by supplying the organic solvent to respective ones of the plurality of substrates after the replacing the first treating liquid, and
wherein the drying the plurality of substrates includes drying an organic solvent on the plurality of substrates with the supercritical fluid.

7. The substrate treating method of claim 4, wherein the second treating bath includes:
an inner bath configured to store the second treating liquid;
an outer bath configured to store at least a portion of the second treating liquid which has overflowed from the inner bath; and
a circulation line configured to circulate the second treating liquid, and
the replacing the first treating liquid includes supplying the second treating liquid through a supply pipe coupled to the inner bath to overflow at least a portion of the second treating liquid from the inner bath to the outer bath and to circulate between the inner bath and the outer bath via the supply pipe and the circulation line and
wherein the supply pipe is below the plurality of substrates positioned in the inner bath.

8. The substrate treating method of claim 2, wherein
the liquid treating further includes supplying the first treating liquid to the substrate, the substrate supported on and rotating together with a spin chuck, and
wherein the replacing the first treating liquid further includes supplying the second treating liquid to the substrate rotating with the spin chuck.

9. The substrate treating method of claim 1, wherein the replacing the first treating liquid on the substrate with a second treating liquid includes directing particulates with a physical force in an upward direction.

10. The substrate treating method of claim 1, wherein the replacing the first treating liquid on the substrate with a second treating liquid includes nucleating particles of the first treating liquid.

11. The substrate treating method of claim 1, wherein the replacing the first treating liquid on the substrate with a second treating liquid includes directing particulates with a physical force in an outward direction.

12. A substrate treating method comprising:
treating a plurality of substrates with a first treating liquid by immersing the plurality of substrates in a first treating bath filled with the first treating liquid, the first treating liquid including a phosphoric acid;
transferring the plurality of substrates to a second treating bath; and
immersing the plurality of substrates in the second treating bath filled with a second treating liquid, the second treating liquid including a water, the second treating liquid replacing the first treating liquid on the plurality of substrates with the second treating liquid, and
wherein the first treating liquid is heated and then provided in the first treating bath, and
the second treating liquid in the second treating bath is provided at a temperature lower than a freezing point of the first treating liquid.

13. The substrate treating method of claim 12, wherein the second treating bath includes:
an inner bath configured to store the second treating liquid;
an outer bath configured to store the second treating liquid which has overflowed from the inner bath; and
a circulation line configured to circulate the second treating liquid, and
the immersing the plurality of substrates includes supplying the second treating liquid through a supply pipe coupled to the inner bath to overflow at least a portion of the second treating liquid from the inner bath to the outer bath and to circulate between the inner bath and the outer bath via the supply pipe and the circulation line, and
wherein the supply pipe is below the plurality of substrates immersed in the inner bath.

* * * * *